(12) United States Patent
Ting et al.

(10) Patent No.: US 7,796,235 B2
(45) Date of Patent: Sep. 14, 2010

(54) METHOD OF MANUFACTURING LIQUID CRYSTAL DISPLAY

(75) Inventors: Chin-Lung Ting, Tainan County (TW); Chun-Bin Wen, Tainan County (TW)

(73) Assignee: Chi Mei Optoelectronics Corp., Tainan County (TW)

( * ) Notice: Subject to any disclaimer, the term of this patent is extended or adjusted under 35 U.S.C. 154(b) by 1041 days.

(21) Appl. No.: 11/446,164

(22) Filed: Jun. 5, 2006

(65) Prior Publication Data

US 2006/0275989 A1 Dec. 7, 2006

(30) Foreign Application Priority Data

Jun. 3, 2005 (TW) .............................. 94118468 A

(51) Int. Cl.
*G02F 1/13* (2006.01)
*G02F 1/1333* (2006.01)
*G02F 1/1335* (2006.01)

(52) U.S. Cl. ........................... 349/187; 349/96; 349/158

(58) Field of Classification Search ............. 349/96–98, 349/187, 158–159
See application file for complete search history.

(56) References Cited

U.S. PATENT DOCUMENTS

| 6,275,277 | B1 * | 8/2001 | Walker et al. ............... 349/113 |
| 7,408,193 | B2 * | 8/2008 | Ishikawa ..................... 257/59 |
| 2004/0179165 | A1 | 9/2004 | Kinoshita et al. |
| 2007/0030439 | A1 | 2/2007 | Kinoshita et al. |
| 2007/0054066 | A1 * | 3/2007 | Usukura et al. ............ 428/1.31 |

FOREIGN PATENT DOCUMENTS

| JP | 2004-046115 A | 2/2004 |
| TW | I279610 | 4/2007 |

* cited by examiner

*Primary Examiner*—Dung T. Nguyen

(57) ABSTRACT

In a method of manufacturing a liquid crystal display, first, a panel assembly structure including a first substrate, a second substrate and several sealants connecting inner surfaces of the first and second substrate is provided. The first substrate includes several third substrates. The second substrate includes several fourth substrates corresponding to the third substrates, respectively. Each third substrate, the corresponding fourth substrate and the corresponding sealant form a panel. First and second polarizers are adhered correspondingly to outer surfaces of the third and fourth substrates. The panels are separated after the adherence of the first and second polarizers.

11 Claims, 17 Drawing Sheets

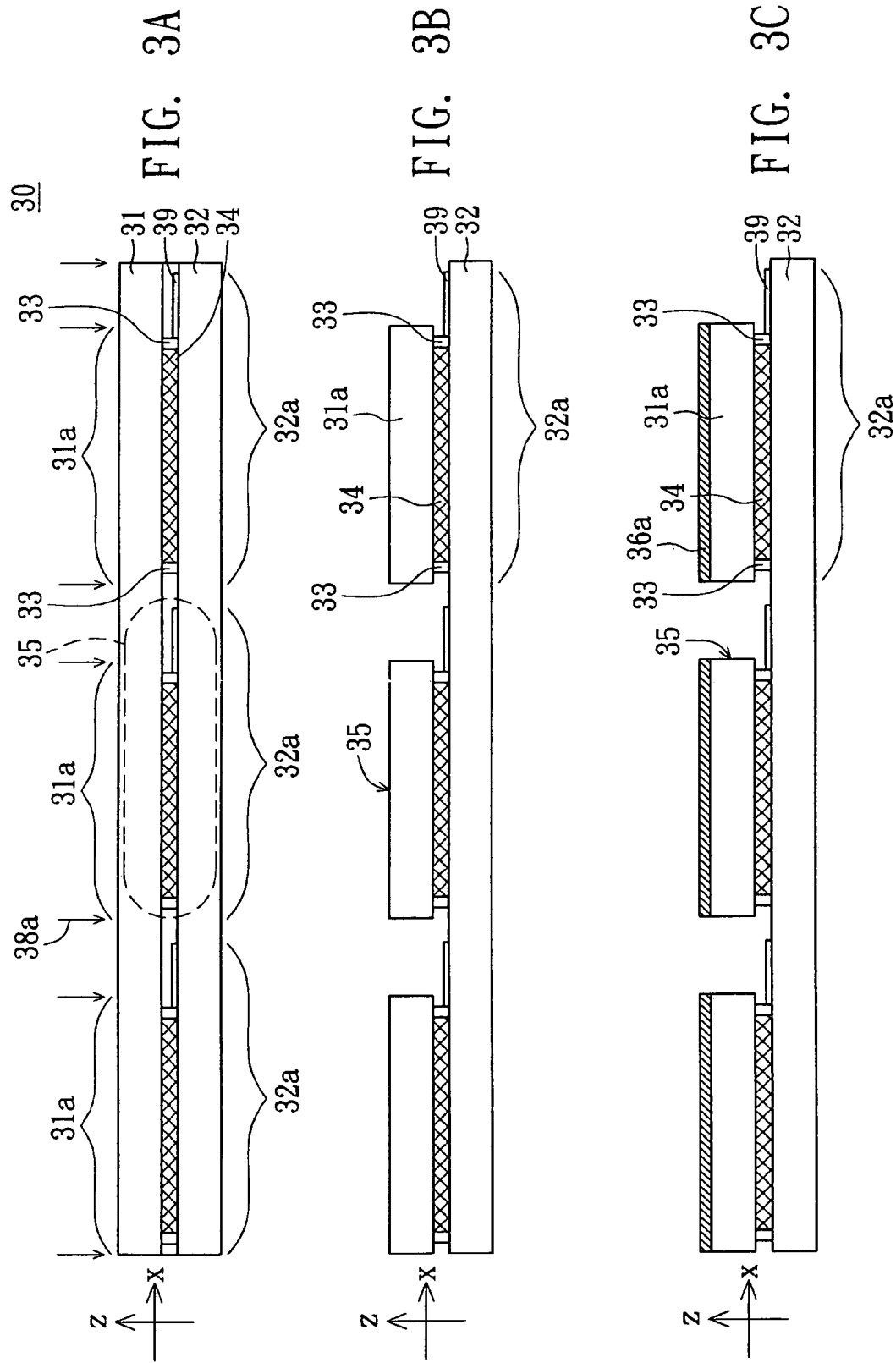

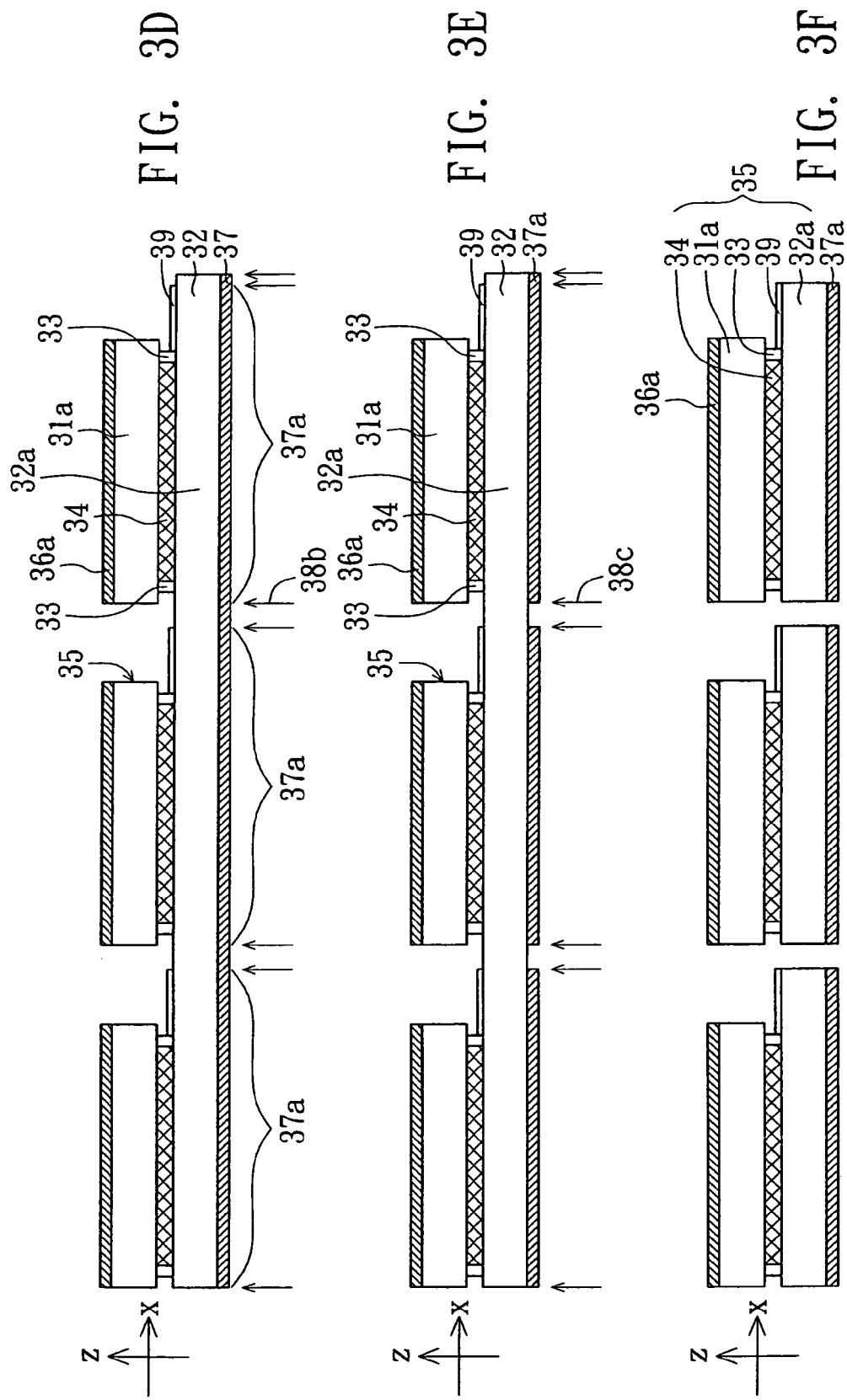

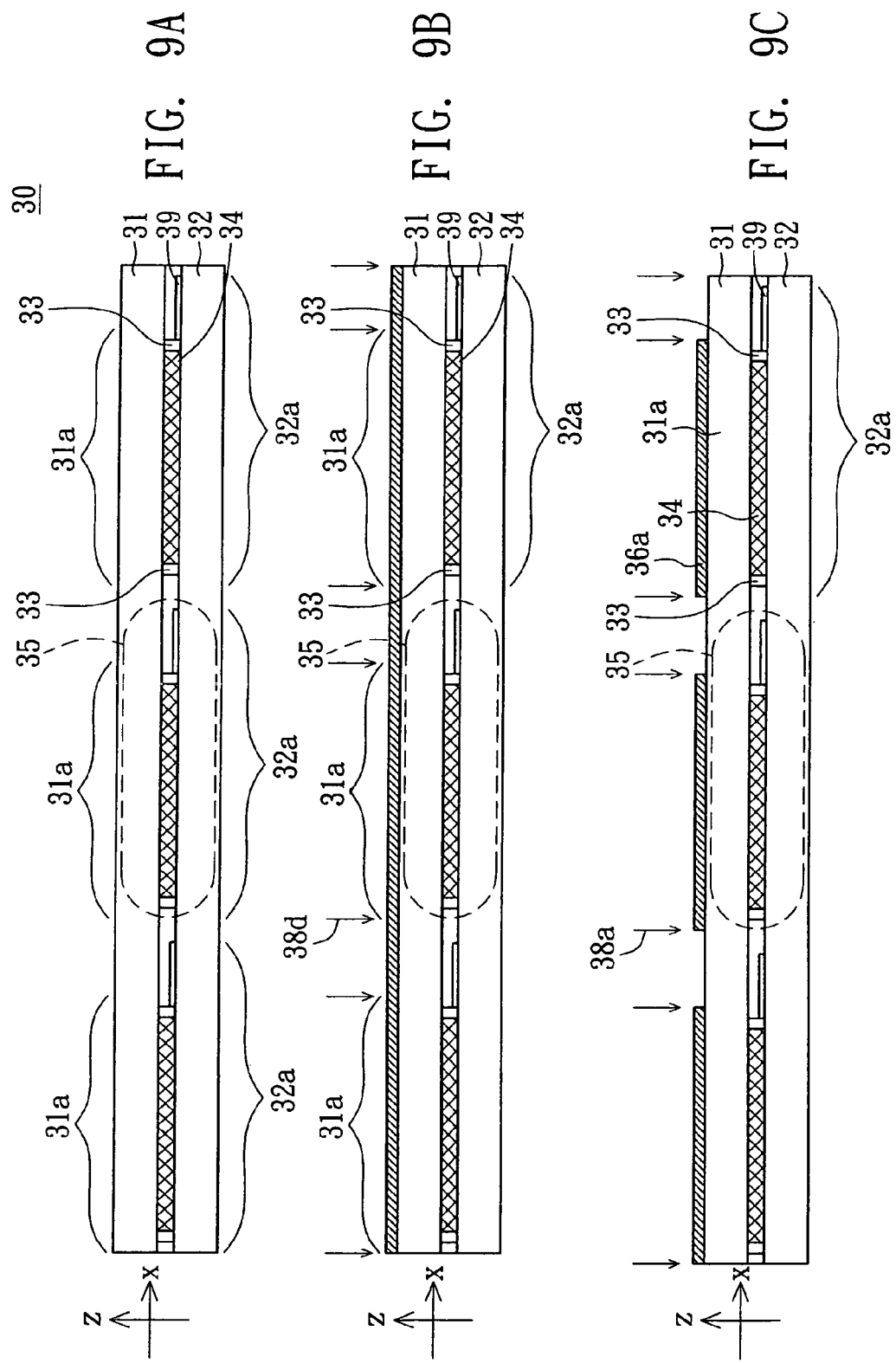

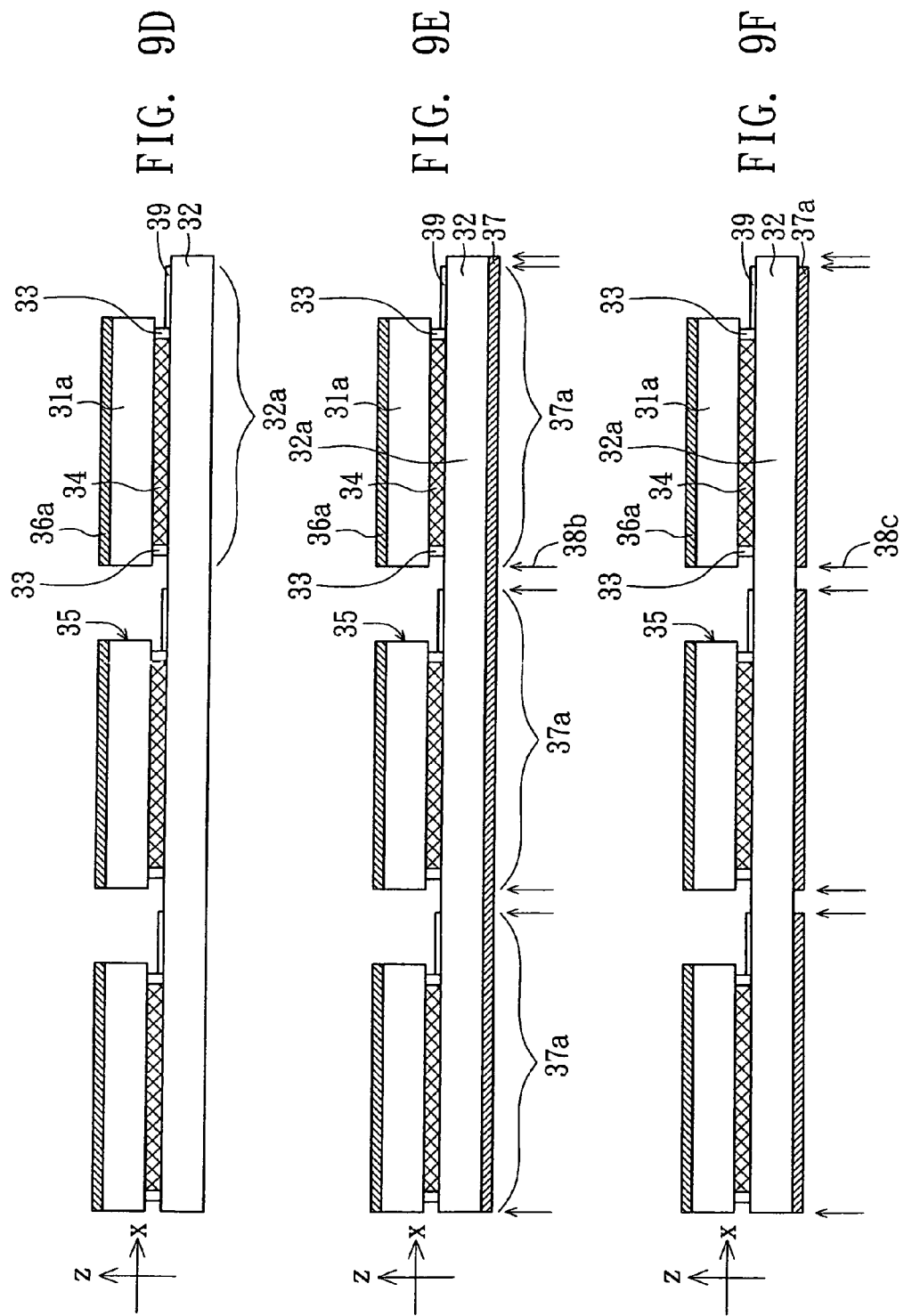

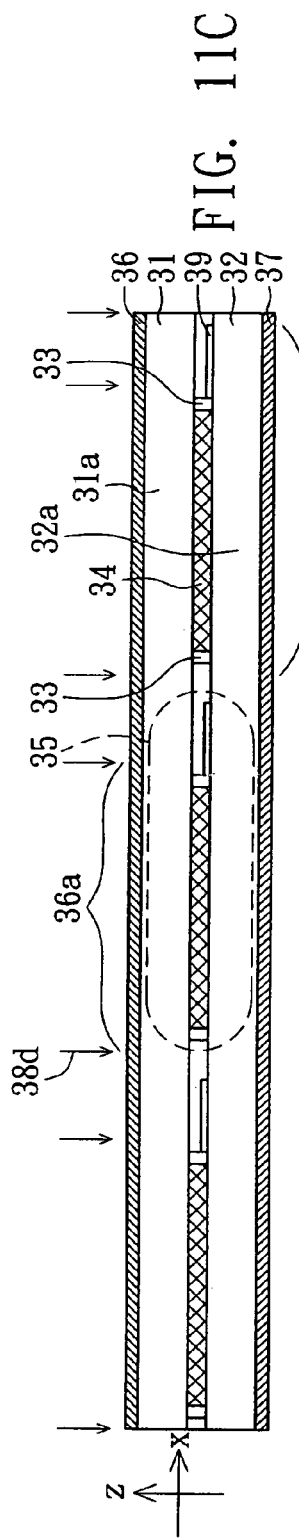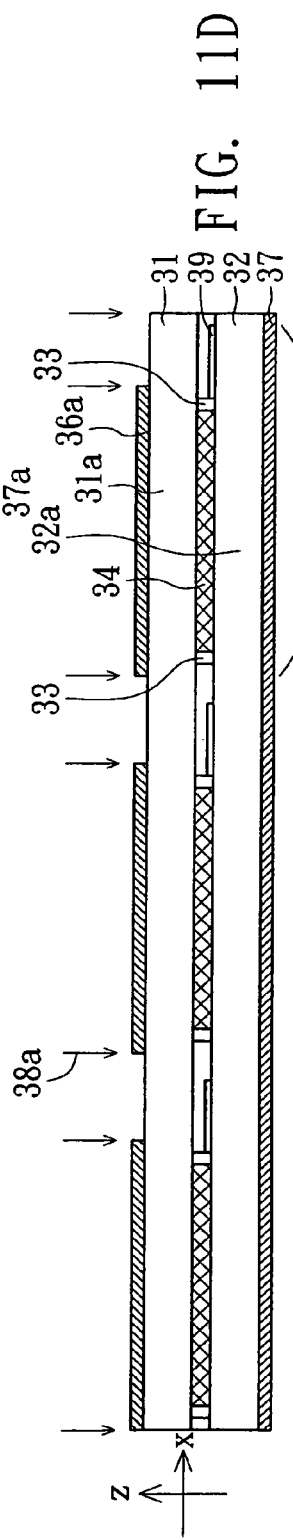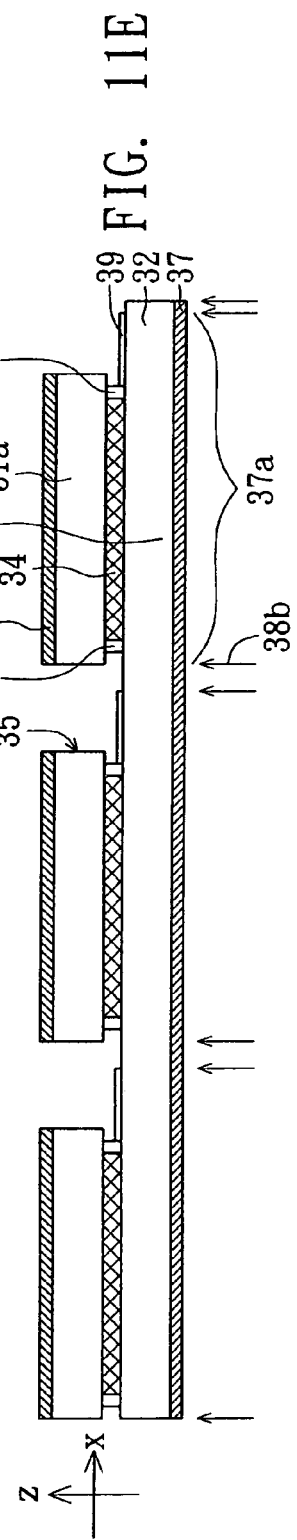

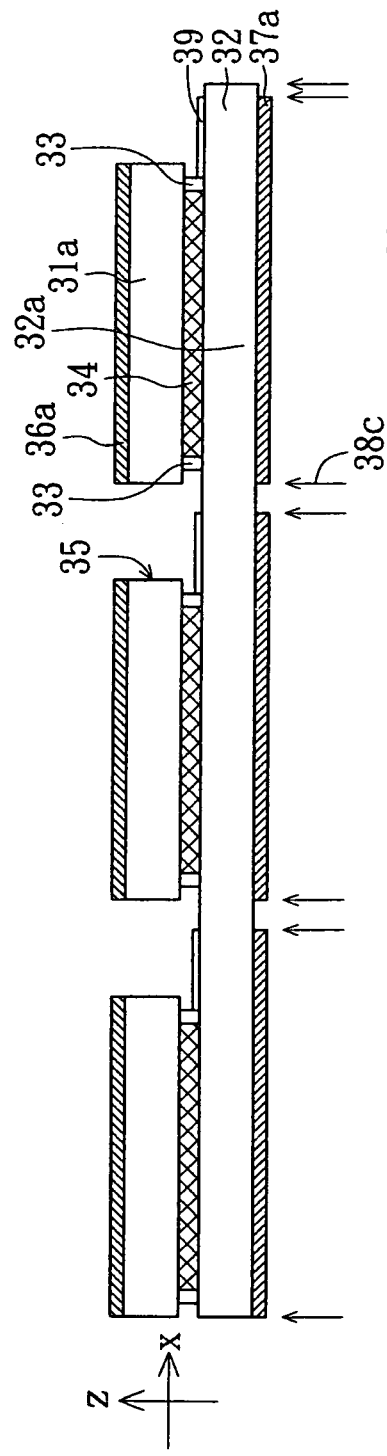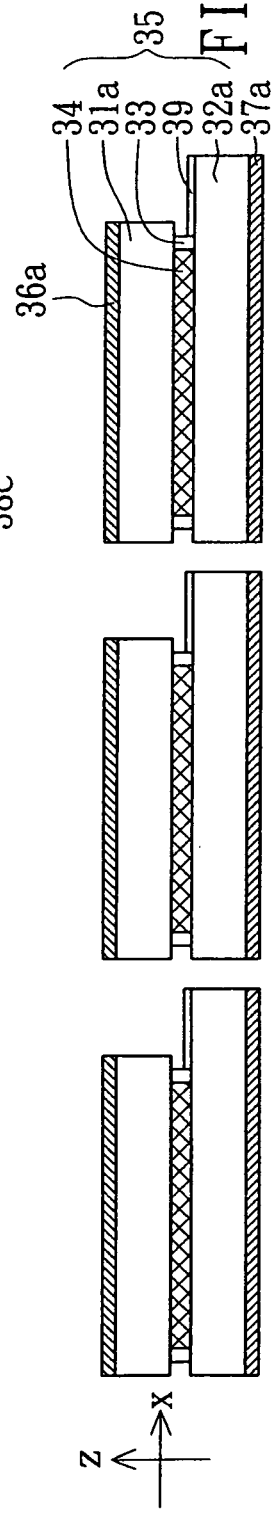

METHOD OF MANUFACTURING LIQUID CRYSTAL DISPLAY

This application claims the benefit of Taiwan application Serial No. 94118468, filed Jun. 3, 2005, the subject matter of which is incorporated herein by reference.

BACKGROUND OF THE INVENTION

1. Field of the Invention

The invention relates to a method of manufacturing liquid crystal displays.

2. Description of the Related Art

Refer to FIG. 1, a flow chart of a conventional method of manufacturing liquid crystal displays (LCDs) is illustrated. In step 11, a panel assembly structure is provided. For example, in the One Drop Fill (ODF) process, the panel assembly structure includes an upper substrate, a lower substrate, several sealants and liquid crystals. The upper substrate and the lower substrate are disposed parallel to each other. The sealants connect the inner surfaces of the first substrate and the second substrate. Liquid crystals are filled between the upper substrate and the lower substrate, and surrounded by the corresponding sealant. The upper substrate includes several color filter (CF) substrates. The lower substrate includes several thin film transistor (TFT) substrates corresponding to the CF substrates, respectively. Each CF substrate, the corresponding TFT substrate, the corresponding sealant and the corresponding liquid crystals are combined to form a liquid crystal display (LCD) panel. In another conventional liquid crystal injection process, each CF substrate, the corresponding TFT substrate and the corresponding sealant are combined to form a panel to be filled with liquid crystals.

Next, in step 12, the upper substrate and the lower substrate are cut by using a wheel cutter, for separating the LCD panels or the panels ready to be filled with liquid crystals. Meanwhile, in the liquid crystal injection process, liquid crystals are injected into each panel ready to be filled with liquid crystals through the liquid crystal injection opening of the corresponding sealant. After the liquid crystals have been injected, the liquid crystal injection openings are sealed and closed. The LCD panels manufactured by the liquid crystal injection process is formed completely in this step.

Then, in step 13, the TFT substrate of each LCD panel is ground and beveled by using a grinding wheel. The grinding wheel mainly grinds two edges of both Gate-driver side and Data-driver side of each TFT substrate that outer leads extend to. The grinding wheel also bevels partially the corners of each TFT substrate. As a result, sharp glass edges are avoided, so that, for example, connecting between a chip in a chip on glass (COG) process and an outer circuit (e.g., a driving PCB) is no more affected by such sharp edges, particularly, in a step of electrically connecting a PCB to the TFT substrate via a flexible circuit board (FPC). Alternatively, a tape automatic bonding (TAB) process is no more affected by such sharp edges, particularly, in a step of electrically connecting a package with a IC chip (also known as a tape carrier package, TCP) to the outer leads through a tape automatic bonding (TAB) process. This grinding and/or beveling process is useful especially because when a flexible circuit board (FPC) or a TCP is electrically connected to the outer leads, the flexible circuit board or the tape is easily damaged by the sharp edges or sharp corners of the TFT substrate, resulting in a decrease in the yield rate of the LCD panels.

In step 14, because many particles, powders or foreign matters are generated in step of grinding and beveling the TFT substrate by using a grinding wheel, each LCD panel is cleaned by water and then scraped to be dry. As a result, the LCD panels are kept clean for the next step. Afterward, in step 15, an upper polarizer and a lower polarizer are adhered correspondingly on outer surfaces of the CF substrate and the TFT substrate in each LCD panel. For example, a light transmission axis of the upper polarizer is perpendicular to a light transmission axis of the lower polarizer. Subsequently, in step 16, a test card is electrically connected to the outer leads of each LCD panel one by one, for inputting test signals. The image quality of each LCD panel is observed by an operator when the LCD panel is under light-emission. Usually each LCD panel is loaded/unloaded on a testing machine one by one by using a robot arm. Then, the test card is electrically connected to the outer leads of the LCD panel on the testing machine for inputting the test signals. The image quality of each LCD panel is preferably observed by the operator when the LCD panel is under light-emission, for singling out defect LCD panels to proceed a re-work process. The qualified LCD panels are continuously sent to the next process station for proceeding the next step, e.g., in step 17, a COG process or a TAB process is proceeded on each LCD panel. For example, a chip is electrically connected to the outer leads through an anisotropic conductive film (ACF) in the COG step. Then, the outer leads are electrically connected to the outer circuit, a driving PCB, through the flexible circuit board (FPC). For another example, the TCP is electrically connected to the outer leads through the ACF in the TAB step, and the PCB is electrically connected to a package through the ACF. As a result, the PCB is electrically connected to the outer leads through the TCP package. Afterward, in step 18, the LCD panel and a backlight module are assembled to form a completed LCD.

However, conventionally, the TFT substrate is ground and beveled in step 13 by using a grinding wheel. As a result, many particles, powders or foreign matters are generated. Therefore, each LCD panel need to be cleaned by water and then is scraped dry in step 14. The manufacturing steps are redundancy and complicated. The cost is raised for purchasing equipment, such as a grinding wheel machine, a cleaning machine and a scraping machine. When the particles, powders or foreign matters are still not cleaned, the LCD panels easily have defects due to the adhesion of such particles, powders or foreign matters.

Moreover, when the LCD panel is not scraped dry in step 14, the polarizers cannot be adhered well in step 15. Further, a Newton ring or a water mark occurs because the water remains on the outer surface of the LCD panel. As a result, the image quality of the LCD is affected.

Furthermore, when the panel assembly structure is cut, e.g., into 502 small-size (for example, 1.2 inch, that is, about 620 mm*750 mm) LCD panels, each LCD panel is attached with polarizers and is tested by the test card. In other words, 502 polarizers are adhered in step 15, and the automatically loaded/unloaded process is proceeded 502 times in step 16 to test all the LCD panels. As a result, it is very time-consuming to adhere polarizers and to test all the LCD panels 502 times. The manufacturing process of the LCD is inefficient and uneconomic.

SUMMARY OF THE INVENTION

In an aspect, the invention to provides a method of manufacturing liquid crystal displays in which polarizers are adhered on the respective substrates before liquid crystal display panels are separated from each other. As a result, the time for adhering the polarizers of the liquid crystal display panels is reduced. In a further aspect, the liquid crystal display panels are tested under light-emission before the liquid crystal display panels are separated from each other. Therefore, the time for testing all the liquid crystal display panels is reduced as well. In another aspect, the substrates of the LCD panels are cut by using lasers, for avoiding particles, powders or foreign matters that would otherwise generated in a conventional step of cutting the substrates by using a wheel cutter. The liquid crystal display panels are prevented from having defects due to adhesion of such powders, particles or powders. In yet another aspect, the liquid crystal display panels are ground and beveled by using a laser. As a result, particles, powders or foreign matters that would otherwise generated in a conventional process of grinding and beveling the liquid crystal display panels by using a grinding wheel are avoided. Thus, the liquid crystal display panels are prevented from having defects due to the adhesion of such particles, powders or foreign matters. The process of manufacturing liquid crystal displays is therefore simplified, also because the conventional step of cleaning and scraping the liquid crystal display panels is skipped. Moreover, the cost is lowered because the expense for the equipment is greatly reduced.

In an aspect, a method of manufacturing liquid crystal displays comprises the steps of: providing a panel assembly structure comprising a first substrate, a second substrate and a plurality of sealants, the first substrate and the second substrate being disposed parallel to each other, the sealants connecting inner surfaces of the first substrate and the second substrate, the first substrate comprising a plurality of first regions defining third substrates, the second substrate comprising a plurality of second regions defining fourth substrates corresponding to the third substrates, respectively, each third substrate, the corresponding fourth substrate and the corresponding sealant together forming an LCD panel; cutting the first substrate for separating the first regions to obtain separated third substrates; adhering a plurality of first polarizers on outer surfaces of the third substrates, respectively; adhering a second polarizer on an outer surface of the second substrate, the second polarizer comprising a plurality of third regions defining third polarizers corresponding to the fourth substrates, respectively; cutting the second polarizer for separating the third regions to obtain separated third polarizers; and cutting the second substrate for separating the second regions to obtain separated fourth substrates, so that the LCD panels are separated from each other after said adhering steps.

In a further aspect, a method of manufacturing liquid crystal displays comprises the steps of: providing a panel assembly structure comprising a first substrate, a second substrate and a plurality of sealants, the first substrates and the second substrate being disposed parallel to each other, the sealants connecting inner surfaces of the first substrate and the second substrate, the first substrate comprising a plurality of first regions defining third substrates, the second substrate comprising a plurality of second regions defining fourth substrates corresponding to the third substrates, respectively, each third substrate, the corresponding fourth substrate and the corresponding sealant together forming an LCD panel; adhering a first polarizer on an outer surface of the first substrate, the first polarizer comprising a plurality of third regions defining second polarizers corresponding to the third substrates, respectively; cutting the first polarizer for separating the third regions to obtain separated second polarizers; cutting the first substrate for separating the first regions to obtain separated third substrates; adhering a third polarizer on an outer surface of the second substrate, the third polarizer comprising a plurality of fourth regions defining fourth polarizers corresponding to the fourth substrates, respectively; cutting the third polarizer for separating the fourth regions to obtain separated fourth polarizers; and cutting the second substrate for separating the second regions to obtain separated fourth substrates, so that the LCD panels are separated from each other after said adhering steps.

In a further aspect, a method of manufacturing liquid crystal displays comprises the steps of: providing a panel assembly structure comprising a first substrate, a second substrate and a plurality of sealants, the first substrate and the second substrate being disposed parallel to each other, the sealants connecting inner surfaces of the first substrate and the second substrate, the first substrate comprising a plurality of first regions defining third substrates, the second substrate comprising a plurality of second regions defining fourth substrates corresponding to the third substrates, respectively, each third substrate, the corresponding fourth substrate and the corresponding sealant together forming an LCD panel; adhering a first polarizer on an outer surface of the first substrate, the first polarizer comprising a plurality of third regions defining second polarizers corresponding to the third substrates, respectively; cutting the first polarizer for separating the third regions to obtain separated second polarizers; cutting the first substrate for separating the first regions to obtain separated third substrates; adhering a third polarizer on an outer surface of the second substrate, the third polarizer comprising a plurality of fourth regions defining fourth polarizers corresponding to the fourth substrates, respectively; cutting the third polarizer for separating fourth regions to obtain separated the fourth polarizers; and cutting the second substrate for separating the second regions to obtain separated fourth substrates, so that the LCD panels are separated from each other after said adhering steps.

In a further aspect, a method of manufacturing liquid crystal displays comprises the steps of: providing a panel assembly structure comprising a first substrate, a second substrate and a plurality of sealants, the first substrate and the second substrate being disposed parallel to each other, the sealants connecting the inner surfaces of the first substrate and the second substrate, the first substrate comprising a plurality of first regions defining third substrates, the second substrate comprising a plurality of second regions defining fourth substrates corresponding to the third substrates, respectively, each third substrate, the corresponding fourth substrate and the corresponding sealant together forming an LCD panel; cutting the first substrate for separating the first regions to obtain separated third substrates; adhering a plurality of first polarizers on outer surfaces of the third substrates, respectively; adhering a plurality of second polarizers corresponding to the fourth substrates, respectively, on an outer surface of the second substrate; and cutting the second substrate for separating the second regions to obtain separated fourth substrates, so that the LCD panels are separated from each other after said adhering steps.

In a further aspect, a method of manufacturing liquid crystal displays comprises the steps of: providing a panel assembly structure comprising a first substrate, a second substrate and a plurality of sealants, the first substrate and the second substrate being disposed parallel to each other, the sealants connecting the inner surfaces of the first substrate and the second substrate, the first substrate comprising a plurality of first regions defining third substrates, the second substrate comprising a plurality of second regions defining fourth substrates corresponding to the third substrates, respectively, each third substrate, the corresponding fourth substrate and the corresponding sealant together forming an LCD panel; adhering a plurality of first polarizers on outer surfaces of the third substrates, respectively; cutting the first substrate for separating the first regions to obtain separated third substrates; adhering a plurality of second polarizers corresponding to the fourth substrates, respectively, on an outer surface of the second substrate; and cutting the second substrate for separating the second regions to obtain separated fourth substrates, so that the LCD panels are separated from each other after said adhering steps.

In a further aspect, a method of manufacturing liquid crystal displays comprises the steps of: providing a panel assembly structure comprising a first substrate, a second substrate and a plurality of sealants, the first substrate and the second substrate being disposed parallel to each other, the sealants connecting the inner surfaces of the first substrate and the second substrate, the first substrate comprising a plurality of first regions defining third substrates, the second substrate comprising a plurality of second regions defining fourth substrates corresponding to third substrates, respectively, each third substrate, the corresponding fourth substrate and the corresponding sealant together forming an LCD panel; adhering a plurality of first polarizers on outer surfaces of the third substrates; adhering a plurality of second polarizers corresponding to the fourth substrates, respectively, on an outer surface of the second substrate; cutting the first substrate for separating the first regions to obtain separated third substrates; and cutting the second substrate for separating the second regions to obtain separated fourth substrates, so that the LCS panels are separated from each other after said adhering steps.

Other objects, features, and advantages of the invention will become apparent from the following detailed description of the preferred but non-limiting embodiments. The following description is made with reference to the accompanying drawings.

BRIEF DESCRIPTION OF THE DRAWINGS

FIGS. 3A~3F are cross-sectional views showing a manufacturing process of the liquid crystal display panel according to the first embodiment of the invention;

FIGS. 9A~9G are cross-sectional views showing a manufacturing process of the liquid crystal display according to the second embodiment of the invention;

FIGS. 11A~11G are cross-sectional views showing a manufacturing process of the liquid crystal display according to the third embodiment of the invention.

DETAILED DESCRIPTION OF EMBODIMENTS OF THE INVENTION

Methods of manufacturing liquid crystal displays in accordance with the invention will be described herein below. In the disclosed methods, polarizers for each liquid crystal display panel are adhered before a panel assembly structure is separated into several liquid crystal display panels. The disclosed methods are advantageous over the conventional method in which the liquid crystal display panels are separated before the polarizers are adhered. As a result, the process of adhering polarizers is simplified and the time required for adhering the polarizers is reduced. Therefore, the yield rate of the manufactured liquid crystal displays is increased greatly.

First Embodiment

Figure 1:
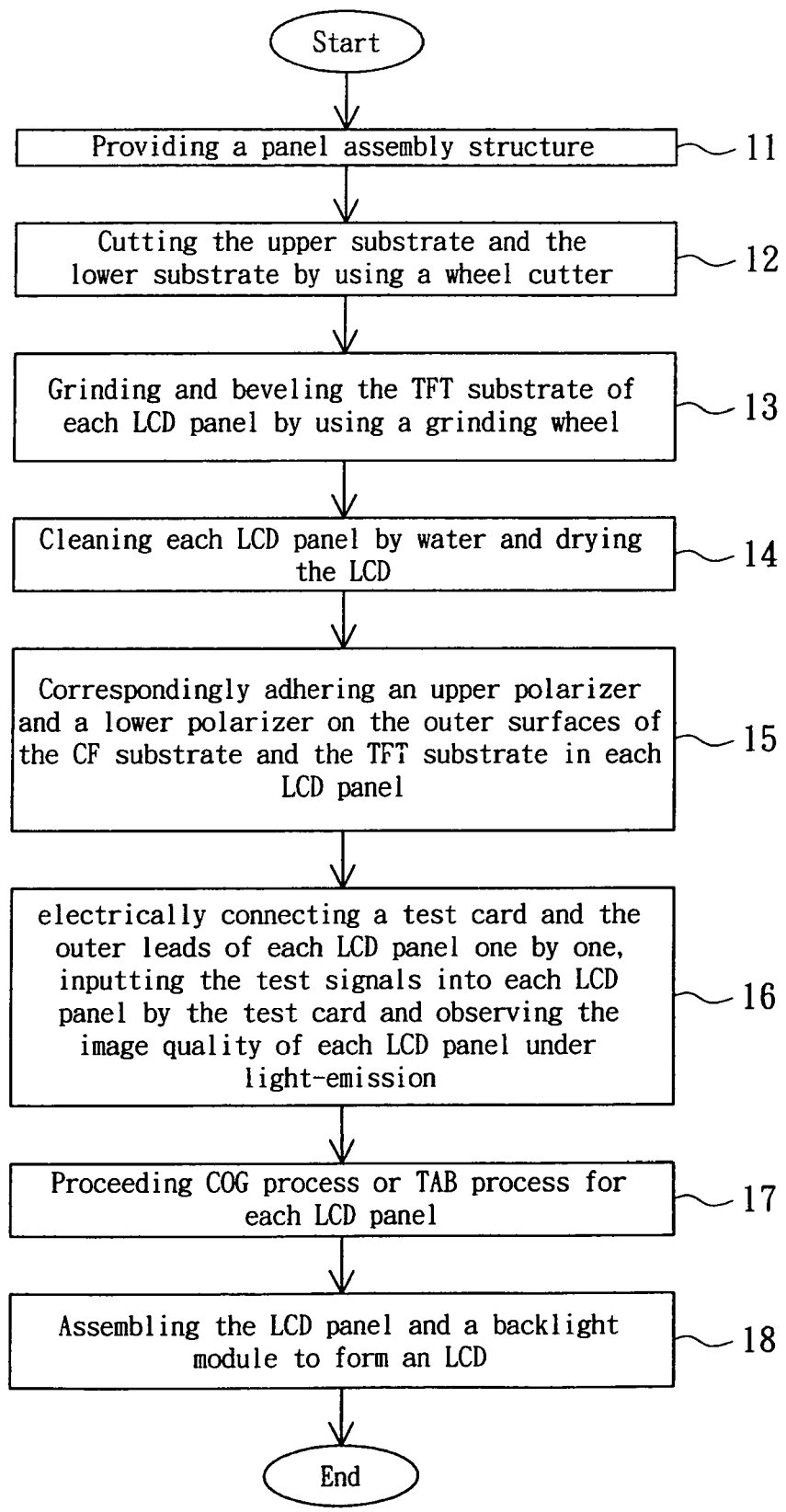
FIG. 1 is a flow chart of a conventional method of manufacturing a liquid crystal display.
Figure 2:
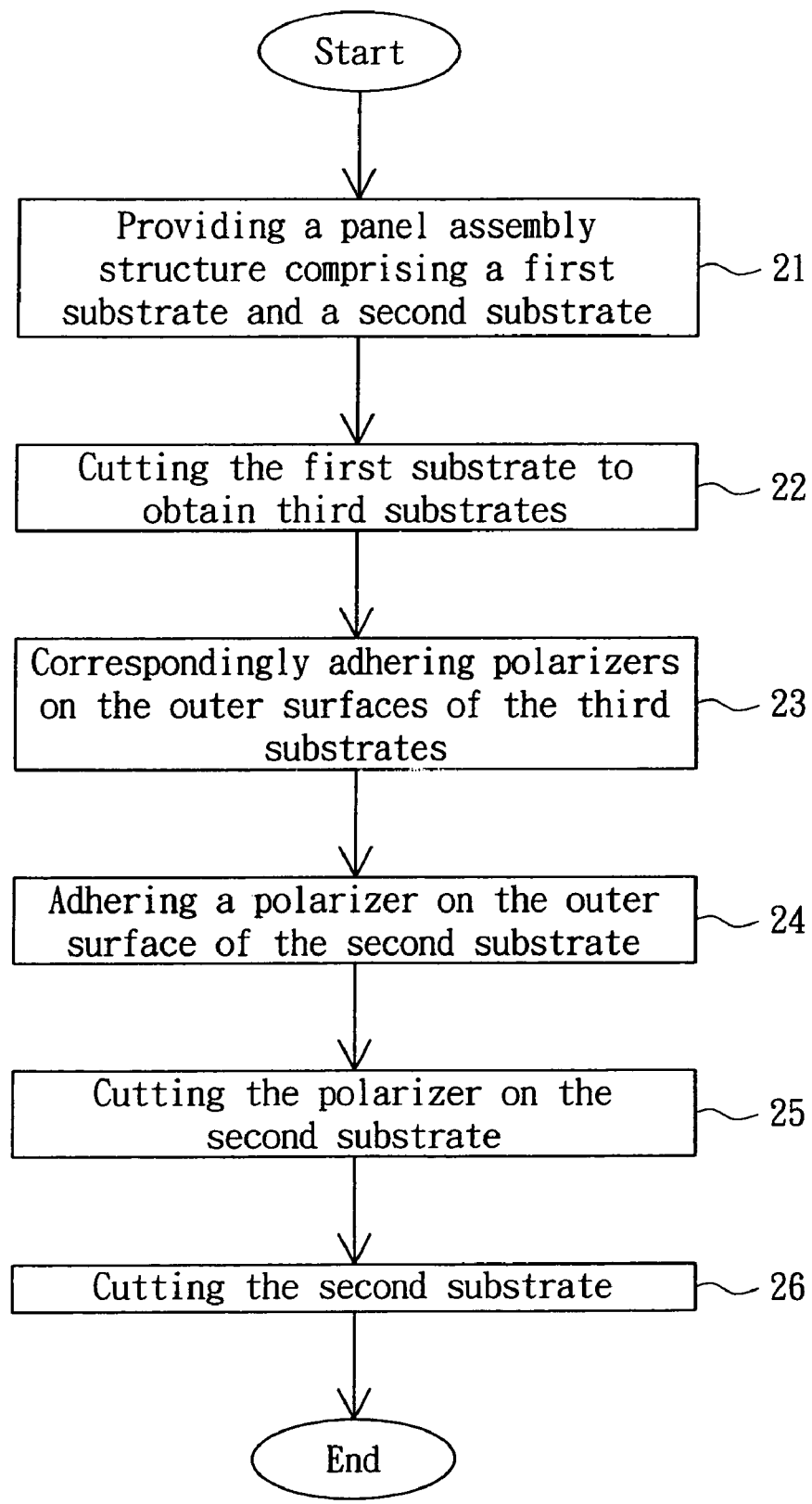
FIG. 2 is a flow chart of a method of manufacturing a liquid crystal display according to a first embodiment of the invention.

Refer to FIGS. 2~3F, FIG. 2 is a flow chart of the method of manufacturing a liquid crystal display according to the first embodiment of the invention, and FIGS. 3A~3F are cross-sectional views showing the manufacturing process of a liquid crystal display according to the first embodiment of the invention. First, in step 21, a panel assembly structure 30 is provided as shown in FIG. 3A. In FIG. 3A, the panel assembly structure 30 includes a first substrate 31, a second substrate 32 and several sealants 33. The first substrate 31 and the second substrate 32 are disposed parallel to each other. The sealants 33 connect inner surfaces of the first substrate 31 and the second substrate 32. The first substrate 31 includes several regions that will define third substrate 31a. The second substrate 32 includes several regions that will define fourth substrates 32a each corresponding to one of the third substrates 31a. Each third substrate 31a, the corresponding fourth substrate 32a and the corresponding sealant 33 are combined to form a panel. When the panel is filled with liquid crystals, the panel is a liquid crystal display panel. When the panel is not yet filled with any liquid crystal, the panel is an unfinished panel ready to be filled with liquid crystals in a following filling process. Besides, the third substrates 31a are preferably color filter substrates, and the fourth substrates 32a are preferably thin film transistor (TFT) substrates although other arrangements are not excluded. The fourth substrate (the thin film transistor substrate) is larger than the third substrate (the color filter substrate). An inner surface of each fourth substrate 32a includes several outer leads 39 located beyond a lateral surface of the corresponding third substrate 31a. In the present embodiment of the invention, the panel assembly structure 30 further includes several liquid crystal cells 34. For example, each liquid crystal cell 34 includes liquid crystals filled between one first substrate 31 and the corresponding second substrate 32, and surrounded by the corresponding sealant 33 by the One Drop Fill (ODF) method. Also, each liquid crystal cell 34 is corresponding to one third substrate 31a and the corresponding fourth substrate 32a. Furthermore, each third substrate 31a, the corresponding fourth substrate 32a, the corresponding sealant 33 and the corresponding liquid crystal cell 34 are combined to form a liquid crystal panel 35. Moreover, the first substrate 31 and the second substrate 32 are preferably glass substrates, insulation substrates or plastic substrates.

Next, in step 22, the first substrate 31 in FIG. 3A is cut by using a first cutting device 38a for separating the third substrates 31a, as shown in FIG. 3B. The outer leads 39 of each fourth substrate 32a are exposed to the surrounding. The first cutting device 38a preferably includes a carbon dioxide ($CO_2$) laser or another kind of laser suitable for cutting a glass substrate, an insulation substrate or a plastic substrate. In the present embodiment, a laser is used for cutting the substrates. As a result, the problem that many particles, foreign matters or powders are generated in a conventional step of cutting the substrate by a machine is solved. Furthermore, burrs are not generated on edges of the cut substrates. Therefore, the separated liquid crystal panels are prevented from having defects due to adhering the particles, foreign matters or powders.

Then, in step 23, polarizers 36a are adhered on outer surfaces of the third substrates 31a, respectively, as shown in FIG. 3C. Many processes can be used for adhering the polarizers. For example, several cracks corresponding to the outlines and positions of the third substrates 31a are formed on a large-sheet polarizer, so that small-piece polarizers within the cracks can be separated from the large-sheet polarizer easily, thereby several polarizers 36a can be formed after the following adhering step. Afterward, the larger polarizer is adhered on the first substrate 31 so that the polarizers 36a correspond to the third substrates 31a, respectively. Then, the larger polarizer is removed except that the polarizers 36a remain adhered on the third substrates 31a correspondingly. In another example, the panel assembly structure which is cut by the first cutting device is moved by an automatic moving platform, such as an x-y stage. Each polarizer 36a is adhered on each third substrate 31a one by one.

Afterward, in step 24, a large-sheet polarizer 37 is adhered on an outer surface of the second substrate 32. The polarizer 37 includes several regions that will define small-size polarizers 37a corresponding to the fourth substrates 32a, as shown in FIG. 3D.

In step 25, the polarizer 37 in FIG. 3D is cut by using a cutting device 38b for separating the polarizers 37a. The unneeded part of the polarizer 37 is removed by tearing or another appropriate means, as shown in FIG. 3E. The above-described cutting device 38b preferably includes an excimer laser, a carbon dioxide ($CO_2$) laser, or another laser suitable for cutting the polarizer. A light transmission axis of the polarizers 36a is perpendicular to that of the polarizers 37a. The polarizer is cut by a laser in the present embodiment, so that particles, foreign matters or powders are not generated. As a result, the cut liquid crystal display panels do not have defects due to the adherence of such particles, foreign matters or powders. Besides, the small-piece polarizers 37a can be adhered correspondingly on the outer surface of the second substrate 32 by the same method described with respect to step 23.

Then, in step 26, the second substrate 32 in FIG. 3E is cut by using a cutting device 38c for separating the fourth substrates 32a. As a result, the liquid crystal display panels 35 are separated from each other, as shown in FIG. 3F. The cutting device 38c preferably includes a carbon dioxide ($CO_2$) laser or another laser suitable for cutting a glass substrate, an insulation substrate, or a plastic substrate.

Although the ODF process is illustrated in the present embodiment, the liquid crystals 34 can also be filled between the other, described steps. In other words, the liquid crystals 34 can be filled between any two steps between the step of cutting the first substrate 31 and the step of cutting the second substrate 32, for example, between the step 22 and the step 23. Alternatively, the liquid crystals 34 can be filled before the step of cutting the first substrate 31, for example, between the step 21 and step 22. The liquid crystals 34 can be filled in the unfinished panels by a conventional vacuum injecting process.

Figure 4A:
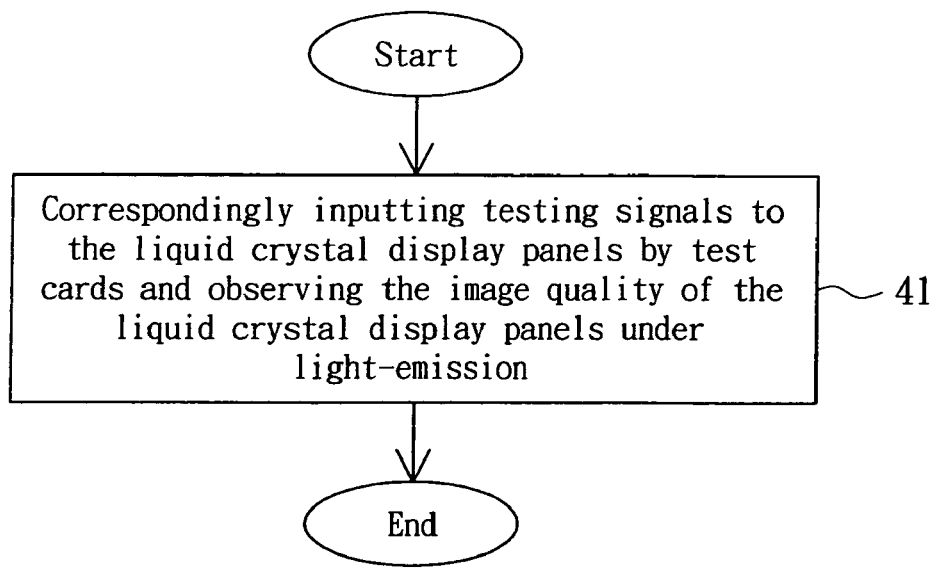
FIG. 4A is a flow chart of a method of testing image quality of each liquid crystal display panel according to the embodiments of the invention.
Figure 4B:
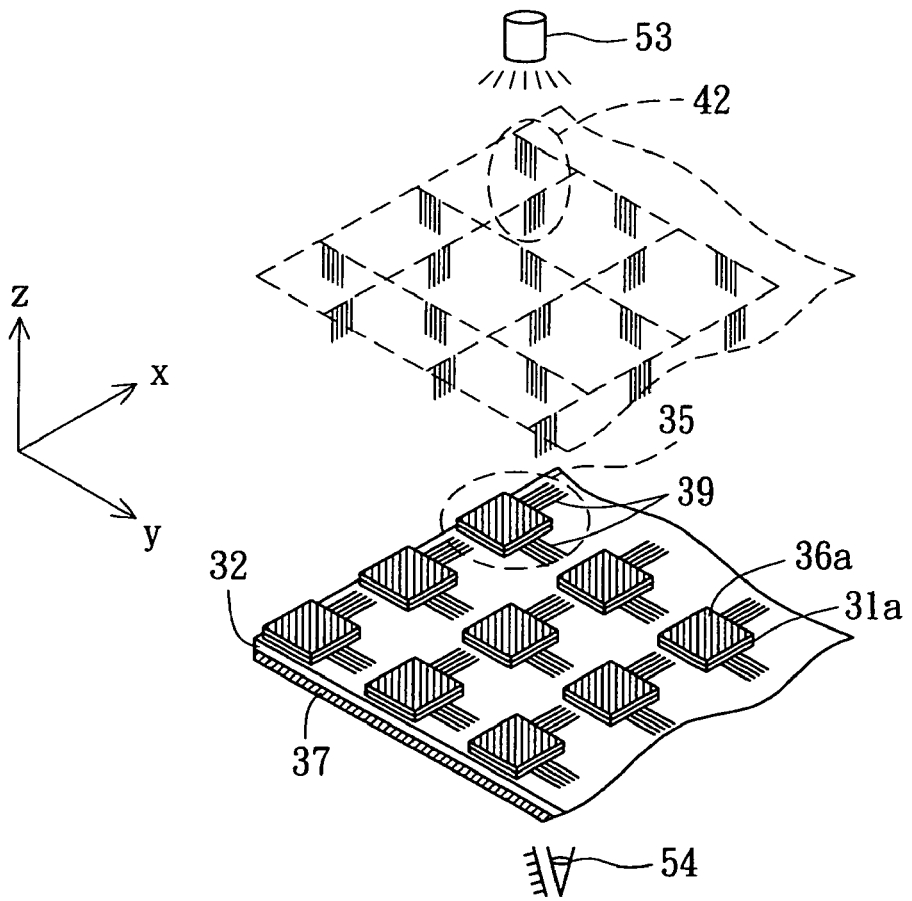
FIG. 4B is a three-dimensional view of several test cards before the test cards are electrically connected to the liquid crystal display panels in FIG. 3D.

In the present embodiment, the image quality of each liquid crystal display panel 35 can be tested between the step 24 and the step 25. There are two kinds of testing processes illustrated as follows. Refer to FIGS. 4A~4B where the first testing process is illustrated. FIG. 4A is a flow chart showing how the image quality of each liquid crystal display panel can be tested according to the embodiment of the invention. FIG. 4B is a three dimensional view of several test cards before the test cards are electrically connected to the liquid crystal display panels obtained in FIG. 3D. In step 41, testing signals are input to the liquid crystal display panels 35 correspondingly by several test cards 42. Light is emitted by a light source 53 from an outer side of the third substrates 31a, so that all the liquid crystal display panels 35 can be observed by an eye 54 of an operator from the outer side of the second substrate 32 at the same time. A contacting terminal of each test card 42 is electrically connected to the outer leads 39 of each liquid crystal display panel 35 correspondingly. As a result, the testing signals are input to each liquid crystal display panel 35, so the image quality of all the liquid crystal display panels 35 under light-emission is tested. The defects of each panel can be observed in the above process of observing a large substrate with several panels. Furthermore, the differences of the image quality among the panels can also be observed.

Figure 5A:
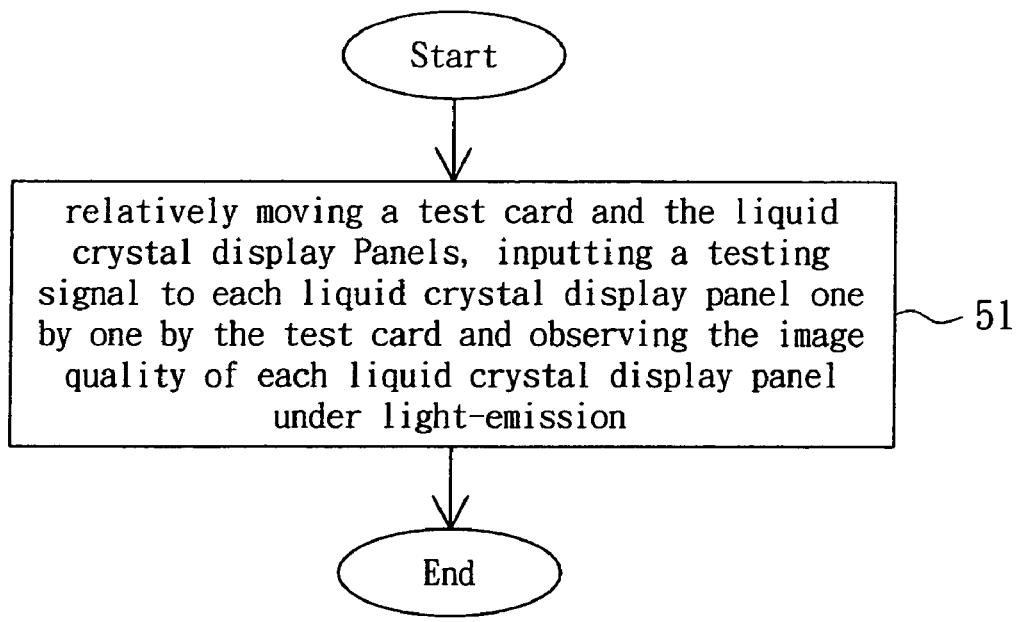
FIG. 5A is a flow chart of another method of testing image quality of each liquid crystal display panel according to the embodiments of the invention.
Figure 5B:
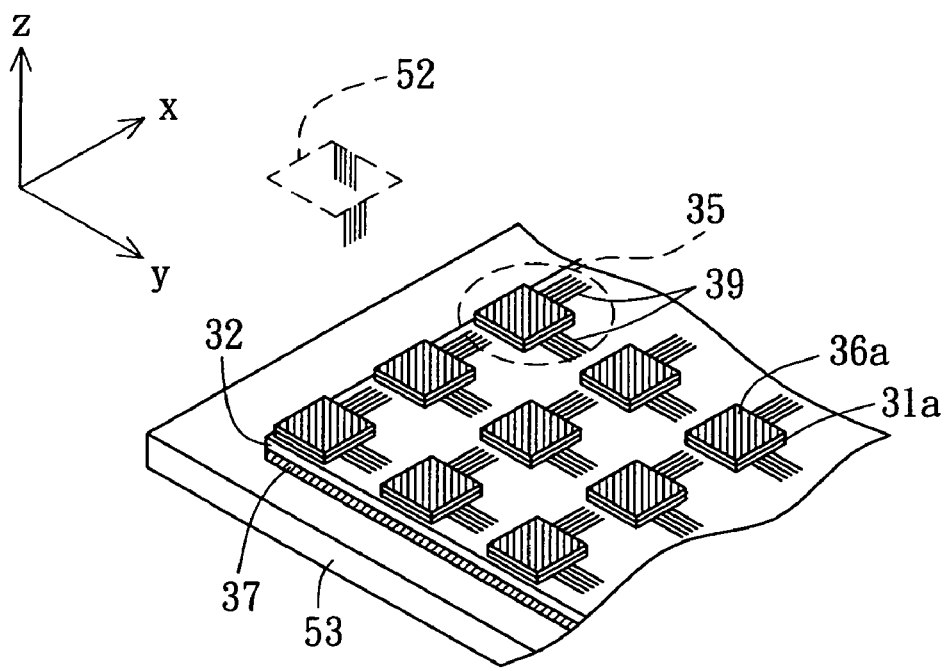
FIG. 5B is a three-dimensional view of one test card before the test card is electrically connected to the liquid crystal display panels in FIG. 3D one at a time.

Refer to FIGS. 5A~5B where the second testing method is illustrated. FIG. 5A is a flow chart showing an alternative method of testing the image quality of each liquid crystal display panel according to the embodiment of the invention. FIG. 5B illustrates a test card before the test card is electrically connected to each liquid crystal display panel in FIG. 3D one by one. A test card 52 and the liquid crystal display panels 35 are moved relatively in step 51. For example, the test card 52 is fixed, and the liquid crystal display panels 35 are moved by a moving platform 53, such as an x-y stage. Next, test signals are input to each liquid crystal display panel 35 by the test card 52 one by one. Then, light is emitted from a lateral side of the third substrates 31a, so that the image quality of each liquid crystal display panel 35 can be observed by an eye of an operator. A contacting terminal of the test card 52 is electrically connected to the outer leads 39 of each liquid crystal display panel 35 one by one, so that testing signals are input to each liquid crystal display panel 35. As a result, the image quality of each liquid crystal display panel under light-emission is tested.

After the liquid crystal display panels 35 are separated from each other, a chip and the liquid crystal display panel 35 are combined through a chip on glass (COG) process. Or, a package with a chip and the liquid crystal display panel 35 are combined through a tape automatic bonding (TAB) process. One liquid crystal display panel 35 is illustrated as follows.

Figure 6A:
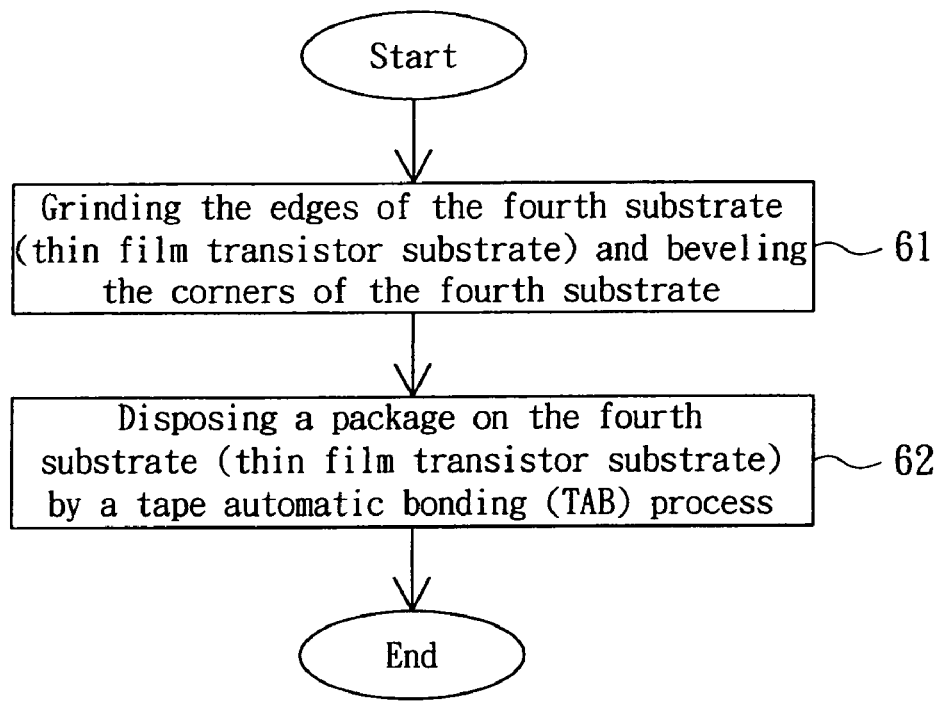
FIG. 6A is a flow chart of a method of combining a chip and the liquid crystal display panel through a tape automatic bonding process according to the embodiments of the invention.
Figure 6B:
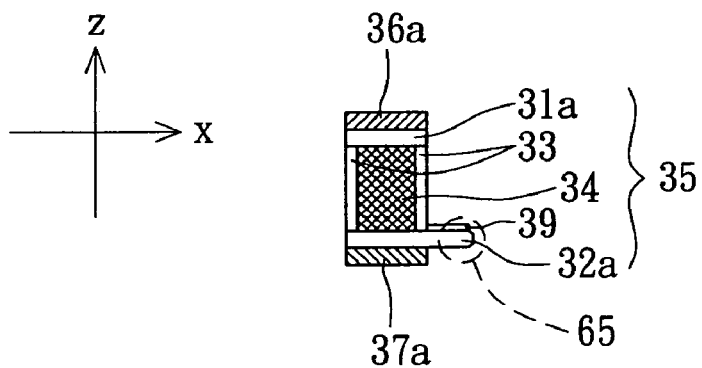
FIG. 6B is a cross-sectional view of the fourth substrate in FIG. 3F after the step of grinding the edges of the fourth substrate by a laser.
Figure 6C:
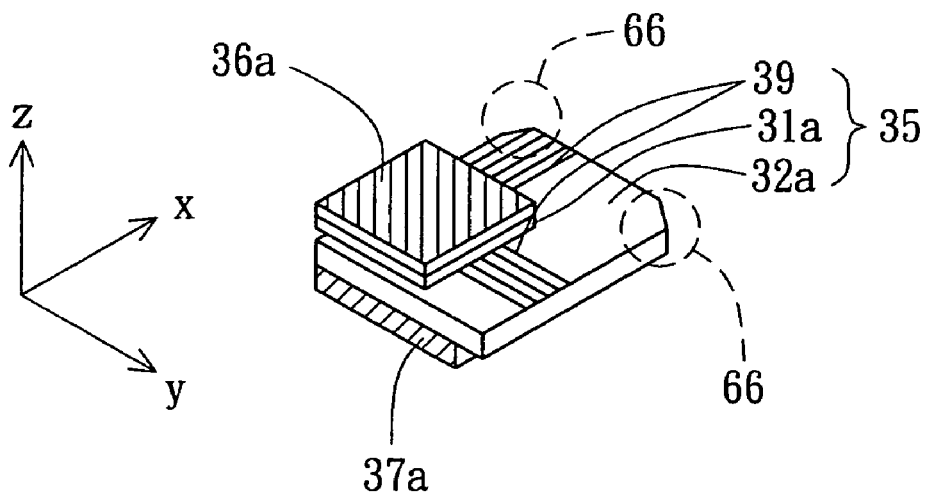
FIG. 6C is a three-dimensional view of the fourth substrate in FIG. 3F after the step of beveling the corners of the fourth substrate by a laser.
Figure 6D:
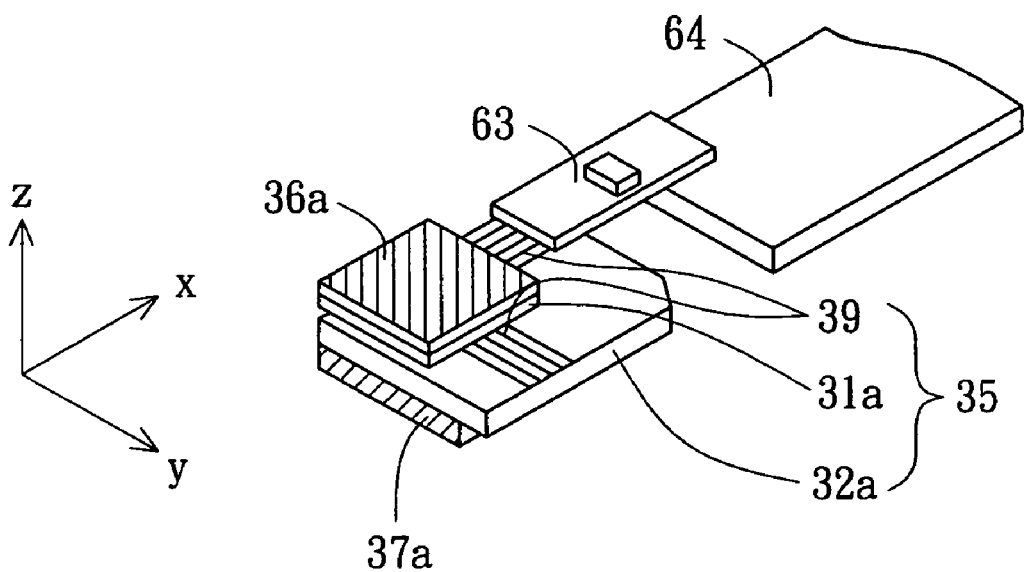
FIG. 6D is a three-dimensional view of a package combined with the liquid crystal display panel through the TAB process.

Refer to FIGS. 6A~6D where the tape automatic bonding (TAB) process is illustrated. FIG. 6A is a flow chart of combining the chip and the liquid crystal display panel through the TAB process according to the embodiment of the invention. FIG. 6B is a cross-sectional view of the fourth substrate in FIG. 3F after the step of grinding the edges of the fourth substrate by a laser. FIG. 6C is a three-dimensional view of the fourth substrate in FIG. 3F after the step of beveling the corners of the fourth substrate by a laser. FIG. 6D is a three-dimensional view of the package combined with the liquid crystal display panel through the TAB process. First, in step 61, the edges and corners of the fourth substrate 32a are ground and beveled by a fourth laser. The edges of the fourth substrate 32a in FIG. 3F are sharp, and the corners of the fourth substrate 32a are about right angles. Therefore, the edges and the corners of the fourth substrate 32a are ground and beveled in step 61 for avoiding the package from being damaged by the sharp edges and corners of the fourth substrate 32a after the package has been combined with the liquid crystal display panel 35. The edges and the corners of the fourth substrate 32a in a thin film transistor substrate are ground and beveled by the fourth laser, as shown in a ground-edge area 65 in a dotted area in FIG. 6B and a beveling area 66 in a dotted area in FIG. 6C.

The edges and corners of the liquid crystal display panel are ground and beveled by a laser in the present embodiment. As a result, the foreign matters or particles generated in a conventional step of grinding and beveling the liquid crystal display panel by a grinding wheel are avoided. Besides, cleaning the foreign matters or the particles by water is not necessary. Defects of the liquid crystal display panel due to the adherence of such foreign matters or particles by is avoided. Afterward, in step 62, a package 63 is disposed on the fourth substrate 32a (the thin film transistor substrate) by a TAB process. The package 63 is electrically connected to the outer leads 39 of the liquid crystal display panel 35 as shown in FIG. 6D. In FIG. 6D, the package 63 is further electrically connected to a circuit board 64. And the package 63 is a tape carrier package (TCP), or the package is completed by a chip on film (COF) process. Therefore, the liquid crystal display panel 35, the polarizer 36a, the polarizer 37a, the package 63, the circuit board 64 and a backlight module are combined to form a completed liquid crystal display.

Figure 7A:
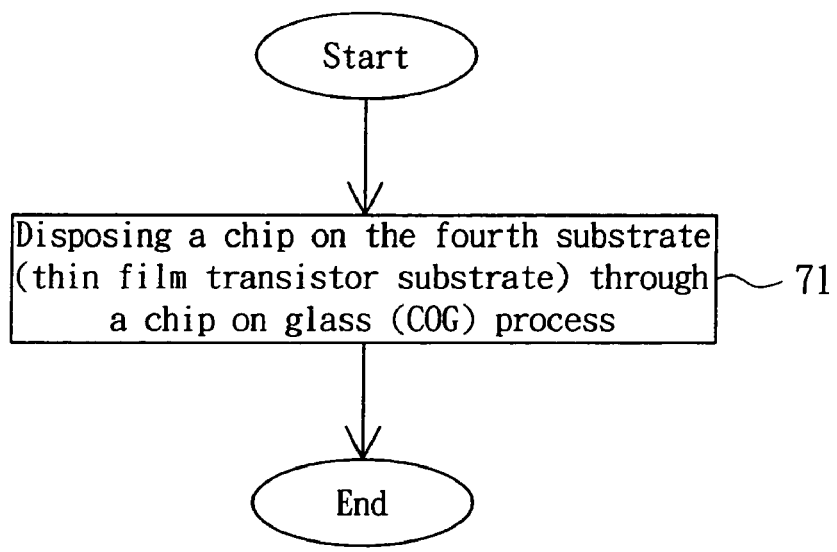
FIG. 7A is a flow chart of a method of combining a chip and the liquid crystal display panel through a chip on glass process according to the embodiments of the invention.
Figure 7B:
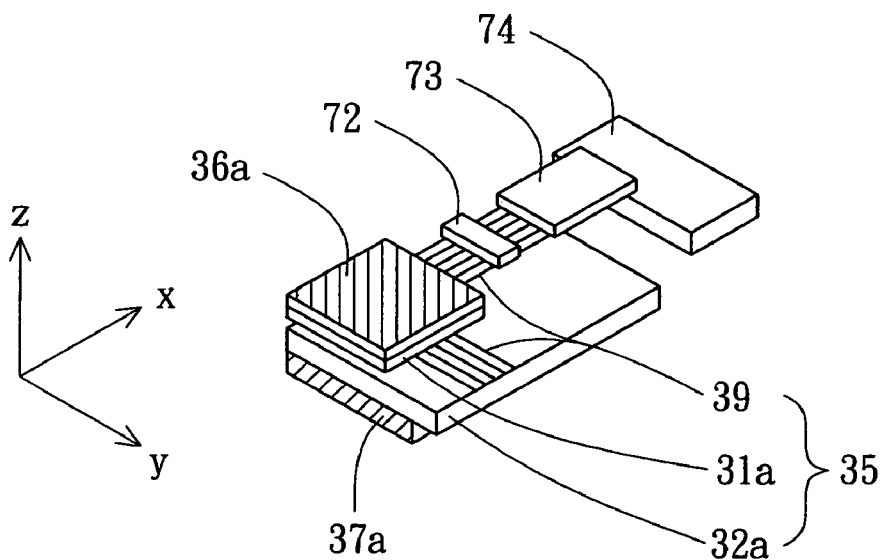
FIG. 7B is a three-dimensional view of a chip after the chip has been combined with the liquid crystal display panel through the chip on glass process.

Refer to FIGS. 7A~7B where the chip on glass process is illustrated FIG. 7A is a flow chart showing how a chip and the liquid crystal display panel can be combined through the chip on glass process according to the embodiment of the invention. FIG. 7B is a three-dimensional view of the chip after the chip has been combined with the liquid crystal display panel through the chip on glass process. In step 71, the chip 72 is disposed on the fourth substrate 32a of the thin film transistor substrate through the chip on glass process. The chip 72 is electrically connected to the outer leads 39 of the liquid crystal display panel 35. The outer leads 39 are electrically connected to a print circuit board (PCB) 74 through the flexible circuit board 73. Or, the step 61 of grinding and beveling the edges and corners of the fourth substrate 32a of the thin film transistor substrate by the fourth laser can be proceeded before the chip 72 is combined with the liquid crystal display panel 35. As a result, the liquid crystal display panel 35, the polarizer 36a, the polarizer 37a, the chip 72 and the backlight module are combined to form a completed liquid crystal display.

However, an ordinarily skilled artisan in the field of the invention can understand that the invention is not limited to the above described processes. For example, several test cards 42 can test all the liquid crystal display panels 35 between the step 22 and the step 23. In other words, the liquid crystal display panels can be tested by several test cards when the outer leads 39 are exposed. Or, one test card 52 is moved relatively to the liquid crystal display panels 35 for testing the liquid crystal display panels 35 one by one. What is worth mentioning is that before the operator observes the image quality of the liquid crystal display panels 35 under light-emission, two large-sheet polarizers are disposed correspondingly on the outer surfaces of the third substrates 31a and the second substrate 32. Furthermore, the sequence of the steps 21~25 can be adjusted properly, and some of the steps 21~25 can be proceeded at the same time. The polarizers of each liquid crystal display panel 35 can be adhered before the liquid crystal display panels 35 are separated in step 26. Similarly, the step of testing the liquid crystal display panels 35 by several test cards or by one test card moved correspondingly to the liquid crystal display panels 35, as shown in FIGS. 4A~5B, can be inserted in the manufacturing process with the adjusted sequence of steps 21~25.

The disclosed feature that the polarizers are adhered before the liquid crystal display panels are separated from each other shortens the adhering time of the polarizers of all the liquid crystal display panels. Furthermore, the disclosed feature that the liquid crystal display panels are tested under light-emission before the liquid crystal display panels are separated from each other shortens the testing time of all the liquid crystal display panels.

For example, when the panel assembly structure is separated into 502 liquid crystal display panels, all the 502 liquid crystal display panels are adhered and tested under light-emission by the test card before the 502 liquid crystal display panels are separated from each other in the present embodiment. In a conventional method, the polarizers are adhered on the 502 liquid crystal display panels one by one, and the 502 liquid crystal display panels are tested one by one as well. The adhering time of the polarizers of the liquid crystal display panels and the testing time of the liquid crystal display panels in the present embodiment are much less than those in the conventional method. As a result, the polarizers are adhered on several panels before the panels are separated from each other. Also, the panels are tested before the panels are separated from each other. Therefore, the manufacturing process of the liquid crystal display panel of the invention is more efficient and more economic than the conventional one.

Moreover, the manufacturing process of the liquid crystal display panel uses a laser to cut the substrate, so that the powders, particles or foreign matters generated in a convention step of cutting the substrate by a wheel cutter are avoided. Defects of the liquid crystal display panels due to the adherence of such powders, particles or foreign matters are avoided. Furthermore, the liquid crystal display panels are ground and beveled by a laser in the present embodiment, so that the powders, particles or foreign matter generated in a conventional step of grinding and beveling the liquid crystal display panels by a grinding wheel are avoided. As a result, defects of the liquid crystal display panels due to the adherence of such powders, particles or foreign matters are avoided. Therefore, the manufacturing process is simplified, and the step of water-cleaning and drying the liquid crystal display panels are skipped. The cost for purchasing the machines is reduced greatly.

Second Embodiment

Figure 8:
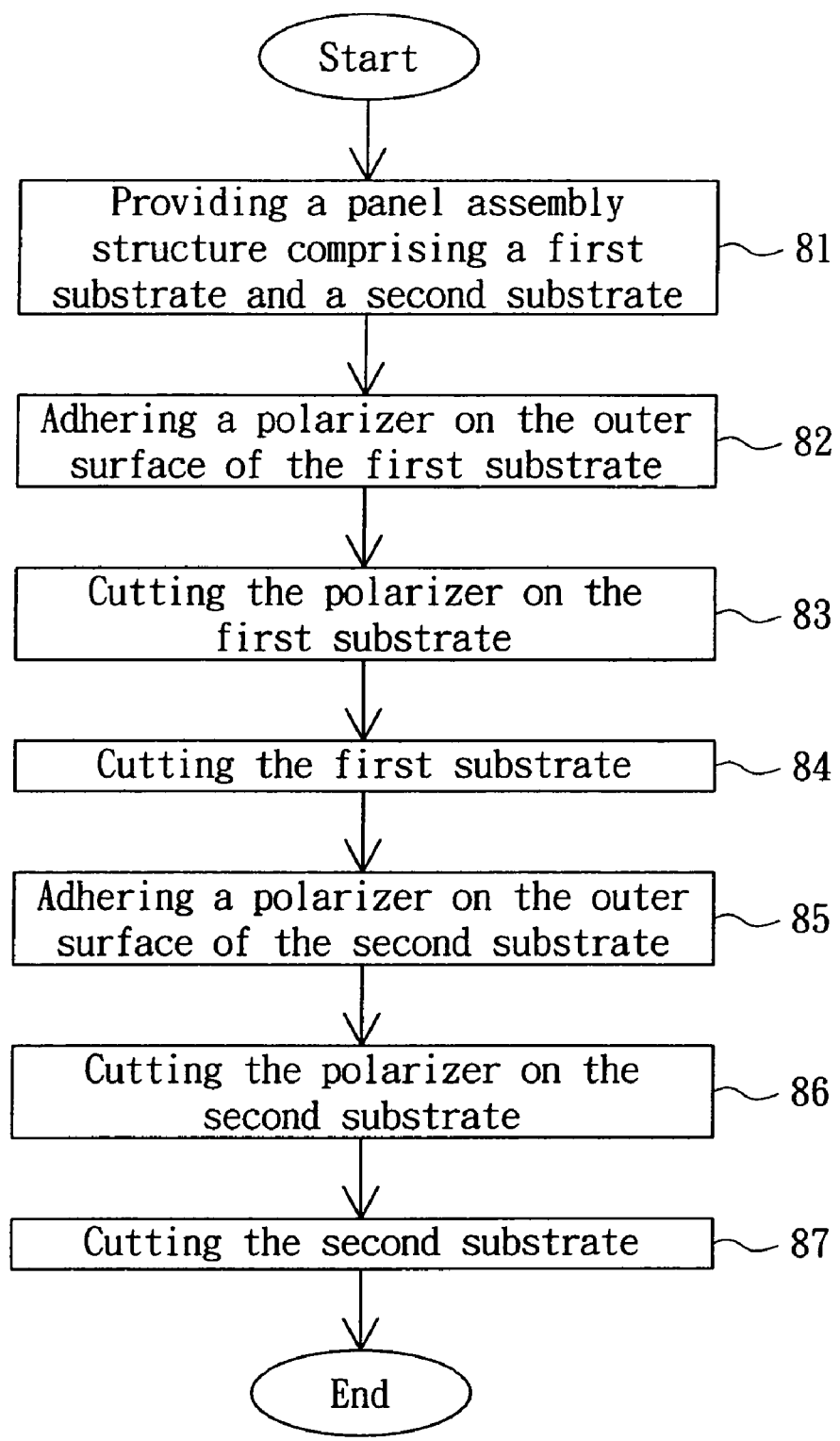
FIG. 8 is a flow chart of a method of manufacturing a liquid crystal display according to a second embodiment of the invention.
Figure 9G:
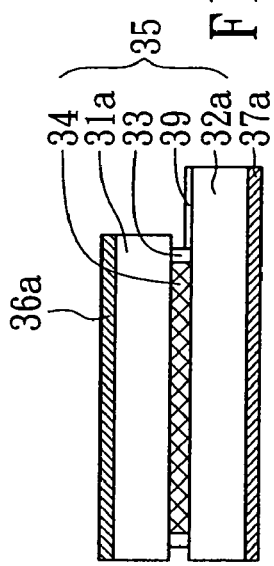

Refer to FIGS. 8~9G, FIG. 8 is a flow chart of a method of manufacturing a liquid crystal display according to the second embodiment of the invention, and FIGS. 9A~9G are cross-sectional views showing the manufacturing process of the liquid crystal display according to the second embodiment of the invention. First, in step 81, a panel assembly structure 30 is provided as shown in FIG. 9A. In FIG. 9A, the panel assembly structure 30 includes a first substrate 31, a second substrate 32 and several sealants 33. The first substrate 31 and the second substrate 32 are disposed parallel to each other. The sealants 33 connect inner surfaces of the first substrate 31 and the second substrate 32. The first substrate 31 includes several regions that will define third substrates 31a. The second substrate 32 includes several regions that will define fourth substrates 32a corresponding to the third substrates 31a. Each third substrate 31a, the corresponding fourth substrate 32a and the corresponding sealant 33 are combined to form a panel. When the panel is filled with liquid crystals, the panel is a liquid crystal display panel. When the panel does not include any liquid crystal, the panel is an unfinished panel ready to be filled with liquid crystals. Besides, the third substrates 31a and the fourth substrates 32a are color filter substrates and thin film transistor substrates respectively. The fourth substrate 32a (the thin film transistor substrate) is larger than the third substrate 31a (the color filter substrate). An inner surface of each fourth substrate 32a includes several outer leads 39 disposed adjacent to and beyond a lateral side of the corresponding third substrate 31a. In the present embodiment of the invention, the panel assembly structure 30 further includes several liquid crystal cells 34. Each liquid crystal cell 34 includes liquid crystals filled between the first substrate 31 and the corresponding second substrate 32, and surrounded by the corresponding sealant 33 through a One Drop Fill (ODF) process. Also, each liquid crystal cell 34 is corresponding to one third substrate 31a and the corresponding fourth substrate 32a. Furthermore, each third substrate 31a, the corresponding fourth substrate 32a, the corresponding sealant 33 and the corresponding liquid crystal cell 34 are combined to form a liquid crystal display panel 35. Moreover, the first substrate 31 and the second substrate 32 are preferably glass substrates, insulation substrates or plastic substrates.

Next, in step 82, a large-sheet polarizer 36 is adhered on an outer surface of the first substrate 31. The polarizer 36 includes several small-piece polarizers 36a corresponding to the third substrates 31a, respectively, as shown in FIG. 9B.

Then, in step 83, the polarizer 36 in FIG. 9B is cut by using a cutting device 38d for separating the polarizers 36a, as shown in FIG. 9C. The cutting device 38d preferably includes an excimer laser, a carbon dioxide laser ($CO_2$) or another laser suitable for cutting the polarizers. Besides, the step 83 of cutting the polarizer 36 by the cutting device 38d can be skipped when the small-piece polarizers 36a are adhered correspondingly on the outer surface of the first substrate 31 by the same method described with respect to step 23.

Afterward, in step 84, the first substrate 31 in FIG. 9C is cut by using a cutting device 38a for separating the third substrates 31a, as shown in FIG. 9D. The outer leads 39 of each fourth substrate 32a are exposed. The cutting device 38a preferably includes a carbon dioxide ($CO_2$) laser or another laser suitable for cutting a glass substrate, an insulation substrate or a plastic substrate.

Thereon, in step 85, a large-sheet polarizer 37 is adhered on an outer surface of the second substrate 32. The polarizer 37 includes several small-piece polarizers 37a corresponding to the fourth substrates 32a, respectively, as shown in FIG. 9E.

Subsequently, in step 86, the polarizer 37 in FIG. 9E is cut by using a cutting device 38b for separating the polarizers 37a, as shown in FIG. 9F. The cutting device 38b preferably includes an excimer laser, a carbon dioxide ($CO_2$) laser and another laser suitable for cutting the polarizers. A light transmission axis of the polarizers 36a is perpendicular to a light transmission axis of the polarizers 37a. Furthermore, the step 85 of cutting the polarizer 37 by the cutting device 38b can be skipped when the small-piece polarizers 37a are adhered correspondingly on the outer surface of the second substrate 32 by the method described with respect to step 23.

Then, in step 87, the second substrate 32 in FIG. 9F is cut by using a cutting device 38c for separating the fourth substrates 32a, so that the liquid crystal display panels 35 are separated from each other, as shown in FIG. 9G. The cutting device 38c preferably includes a carbon dioxide ($CO_2$) laser or another laser suitable for cutting the glass substrate, an insulation substrate or a plastic substrate by the same method described with respect to step 23.

Although the ODF process is illustrated in the present embodiment, the liquid crystals 34 can be filled between the other, described steps. In other words, the liquid crystals 34 can be filled before the step of cutting the first substrate 31, for example, between the step 81 and the step 82. In the present embodiment of the invention, the liquid crystals 34 can be filled through a vacuum injection process.

The image quality of each liquid crystal display panel 35 can be tested as described above with respect to the first embodiment and FIGS. 4A-5B. However, an ordinarily skilled artisan the field of the invention can understand that the invention is not limited the above described processes. For example, the image quality of each liquid crystal display panel 35 can be tested between any of two steps between steps 85~87. After the liquid crystal display panels 35 are separated from each other, a chip and the liquid crystal display panel 35 are combined through a chip on glass process. Or, a package with a chip and the liquid crystal display panel 35 are combined through a TAB process. The TAB process has been described with respect to FIGS. 6A~7B. Furthermore, the liquid crystal display panels 35 can be tested by several test cards 42 when the outer leads 39 of each liquid crystal display panel 35 are exposed between steps 84~85. Or, each liquid crystal display panel 35 can be tested by one test card 52 when the test card 52 is moved relatively to each liquid crystal display panel 52. What is worth mentioning is that a large-sheet polarizer is disposed correspondingly on the outer surface of the second substrate 32 before the image quality of the liquid crystal display panels 35 under light-emission is observed by an operator. Furthermore, the sequence of the steps 81~86 can be adjusted properly. Or, some of the steps 81~86 can be proceeded at the same time. As a result, the polarizers of each liquid crystal display panel 35 can be still adhered before the step 87 of separating the liquid crystal display panels 35. Similarly, the step of testing the liquid crystal display panels 35 by several test cards or one test card which is moved correspondingly to the liquid crystal display panels, as shown in FIGS. 4A~5B, can be inserted in the manufacturing process with the adjusted sequence of steps 81~86.

Third Embodiment

Figure 10:
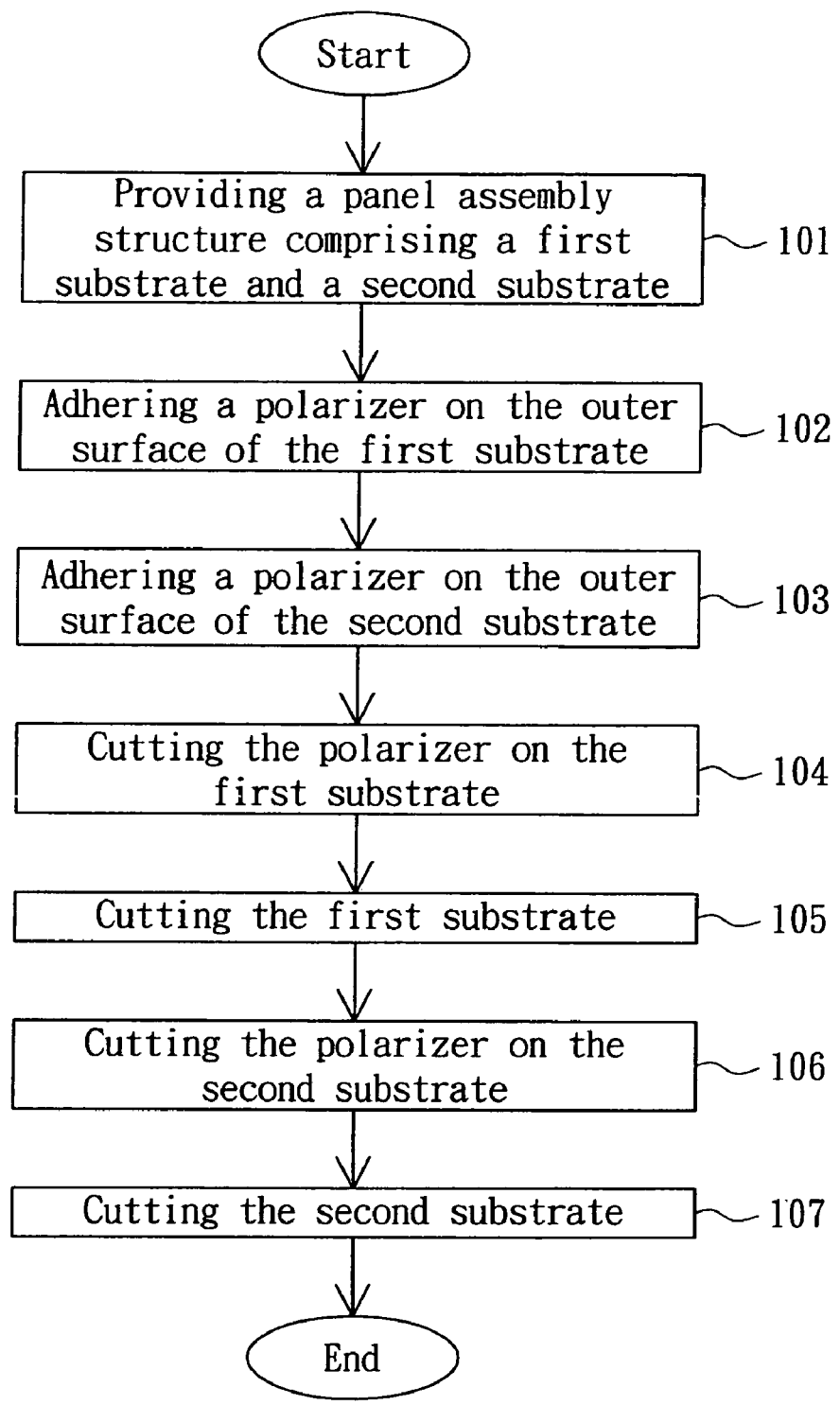
FIG. 10 is a flow chart of a method of manufacturing a liquid crystal display according to a third embodiment of the invention.
Figures 11A, 11B:
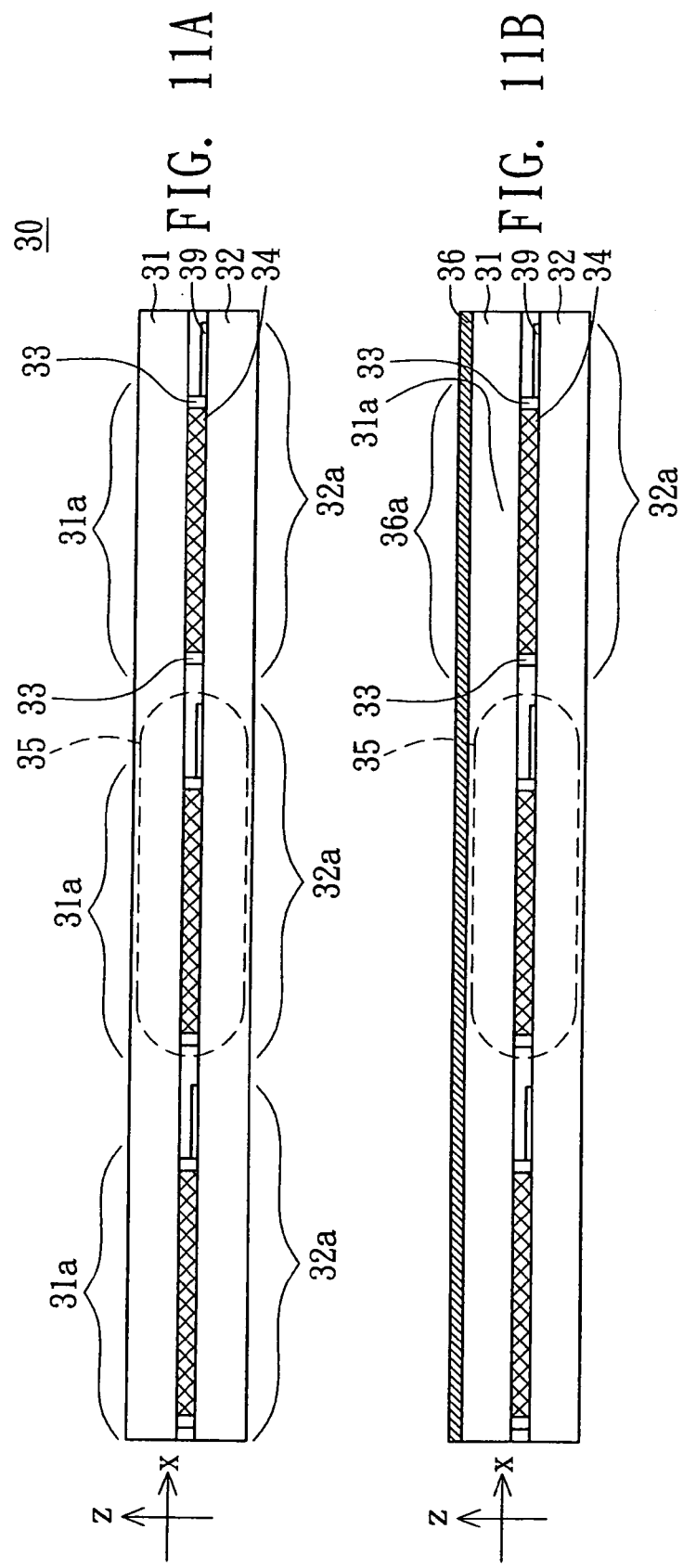

Refer to FIGS. 10~11H, FIG. 10 is a flow chart of a method of manufacturing a liquid crystal display according the third embodiment of the invention, and FIGS. 11A~11G are cross-sectional views showing a manufacturing process of the liquid crystal display according to the third embodiment of the invention. First, in step 81, a panel assembly structure 30 is provided, as shown in FIG. 11A. In FIG. 11A, the panel assembly structure 30 includes a first substrate 31, a second substrate 32 and several sealants 33. The first substrate 31 and the second substrate 32 are disposed parallel to each other.

The sealants 33 connect inner surfaces of the first substrate 31 and the second substrate 32. The first substrate 31 includes several regions that will define third substrates 31a. The second substrate 32 includes several regions that will define fourth substrates 32a corresponding to the third substrates 31a. Each third substrate 31a, the corresponding fourth substrate 32a and the corresponding sealant 33 are combined to form a panel. When the panel is filled with liquid crystals, the panel is a liquid crystal display panel. When the panel does not include any liquid crystal, the panel is an unfinished panel ready to be filled with liquid crystals. Furthermore, the third substrates 31a and the fourth substrates 32a are preferably color filter substrates and thin film transistor substrates respectively. The fourth substrate 32a (the thin film transistor substrate) is larger than the third substrate 31a (the color filter substrate). An inner surface of each fourth substrate 32a includes several outer leads 39 disposed adjacent and beyond a lateral side of the corresponding third substrate 31a. In the present embodiment, the panel assembly structure 30 further includes several liquid crystal cells 34. Each liquid crystal cell includes liquid crystals 34 filled between each pair of first substrate 31 and second substrate 32, and surrounded by the corresponding sealant 33. Also, each liquid crystal cell 34 is corresponding to one third substrate 31a and the corresponding fourth substrate 32a. Moreover, each third substrate 31a, the corresponding fourth substrate 32a, the corresponding sealant 33 and the corresponding liquid crystal cell 34 are combined to form a liquid crystal display panel 35. Furthermore, the first substrate 31 and the second substrate 32 are preferably glass substrates, insulation substrates or plastic substrates.

Next, in step 102, a large-sheet polarizer 36 is adhered on an outer surface of the first substrate 31. The polarizer 36 includes several small-piece polarizers 36a corresponding to the third substrates 31a, respectively, as shown in FIG. 11B.

Then, in step 103, a large-sheet polarizer 37 is adhered on an outer surface of the second substrate 32. The polarizer 37 includes several small-piece polarizers 37a corresponding to the fourth substrates 32a, respectively, as shown in FIG. 11C.

Afterward, in step 104, the polarizer 36 in FIG. 11C is cut by using a cutting device 38d for separating the polarizers 36a, as shown in FIG. 11D. The cutting device 38d preferably includes an excimer laser, a carbon dioxide ($CO_2$) laser, or another laser suitable for cutting the polarizer. Furthermore, the step 104 of cutting the polarizer 36 by the cutting device 38d can be skipped when the small-piece polarizers 36a are adhered correspondingly on the outer surface of the first substrate 31 by the same method described with respect to step 23.

In step 105, the first substrate 31 is cut by using a cutting device 38a for separating the third substrates 31a, as shown in FIG. 11E. The outer leads 39 of each fourth substrate 32a are exposed. The cutting device 38a preferably includes carbon dioxide ($CO_2$) laser or another laser suitable for cutting a glass substrate, an insulation substrate or a plastic substrate.

Subsequently, in step 106, the polarizer 37 is cut by using a cutting device 38b for separating the polarizers 37a, as shown in FIG. 11F. The cutting device 38b preferably includes an excimer laser, a carbon dioxide ($CO_2$) laser or another laser suitable for cutting a polarizer. A light transmission axis of the polarizers 36a is substantially perpendicular to a light transmission axis of the polarizers 37a. Furthermore, the step 106 of cutting the polarizer 37 by the cutting device 38b can be skipped when the small-piece polarizers 37a are adhered on the outer surface of the second substrate 32 by the same method described with respect to step 23.

Later, in step 107, the second substrate 32 in FIG. 11F is cut by using a cutting device 38c for separating the fourth substrates 32a. As a result, the liquid crystal display panels 35 are separated form each other, as shown in FIG. 11G. The cutting device 38c preferably includes a carbon dioxide ($CO_2$) laser or another laser suitable for cutting a glass substrate, an insulation substrate or a plastic substrate.

Although the One Drop Fill (ODF) process is illustrated in the present embodiment, the liquid crystals 34 can be filled between the other described steps. In other words, the liquid crystals 34 can be filled before adhering the polarizer on the outer side of the first substrate 31. For example, the liquid crystals 34 can be filled between the step 101 and the step 102. Each liquid crystal 34 can be filled through a vacuum injection process.

The image quality of each liquid crystal display panel 35 can be tested as described above with respect to the first embodiment and FIGS. 4A-5B. However, an ordinarily skilled artisan the field of the present invention can understand that the invention is not limited the above described processes. For example, the image quality of each liquid crystal display panel 35 can be tested between any of two steps between steps 105~107. After the liquid crystal display panels 35 are separated from each other, a chip and the liquid crystal panel 35 are preferably combined through a chip on glass process. Or, a package with a chip and the liquid crystal display panel 35 are combined through a TAB process, as shown in FIGS. 6A~7B. Furthermore, the sequence of the steps 101~106 can be adjusted properly. Or, some of the steps 101~106 can be proceeded at the same time. The polarizers of each liquid crystal display panel 35 can be still adhered before the liquid crystal display panels are separated from each other in step 107. Similarly, step 35 of testing the liquid crystal display panels 35 by several test cards or one test card which is moved relatively to the liquid crystal display panels 35, as shown in FIGS. 4A~5B, can be inserted in the manufacturing process with the adjusted sequence of steps 101~106.

In the method of manufacturing a liquid crystal display according to the embodiments of the invention, the polarizers are adhered before the liquid crystal display panels are separated from each other. Therefore, the time for adhering the polarizers of all the liquid crystal display panels is shortened. Furthermore, the image quality of all the liquid crystal display panels under light-emission is tested before the liquid crystal display panels are separated from each other. As a result, the time for testing all the liquid crystal display panels by one or more test card is shortened. Moreover, the substrate is cut by a laser in the embodiments of the invention. As a result, powders, particles or foreign matters generated in a conventional step of cutting the substrate by a wheel cutter are avoided. Defects of liquid crystal display panels due to the adherence of such powders, particles or foreign matters can be avoided. Besides, the liquid crystal display panels are ground and beveled by a laser in the disclosed embodiments of the invention. Thus, powders, particles or foreign matters generated in a conventional step of grinding and beveling the liquid crystal display panels by a grinding wheel are avoided. As a result, defects of liquid crystal display panels due to the adherence of such powders, particles or foreign matters are avoided. Therefore, the manufacturing process is simplified. Also, the step of cleaning and drying the liquid crystal display panels is skipped. The cost of purchasing the machines is reduced greatly.

While the invention has been described by way of example and in terms of one or more preferred embodiment, it is to be understood that the invention is not limited thereto. On the contrary, it is intended that the invention covers various modifications and similar arrangements and procedures, and the scope of the appended claims therefore should be accorded the broadest interpretation so as to encompass all such modifications and similar arrangements and procedures.

What is claimed is:

1. A method of manufacturing liquid crystal displays, said method comprising the steps of:
providing a panel assembly structure comprising
a first substrate, a second substrate and a plurality of sealants,
the first substrate and the second substrate being disposed parallel to each other,
the sealants connecting inner surfaces of the first substrate and the second substrate,
the first substrate comprising a plurality of first regions,
the second substrate comprising a plurality of second regions corresponding to the first regions, respectively,
each first region of the first substrate, the corresponding second region of the second substrate and the corresponding sealant together forming an LCD panel, and
the second substrate further comprising, on the inner surface thereof and in each second region, outer leads of the corresponding LCD panel;
adhering a first polarizer on an outer surface of the first substrate, the first polarizer comprising a plurality of third regions corresponding to the first regions of the first substrate, respectively;
cutting the first polarizer to separate the third regions of the first polarizer into separated second polarizers each for a respective one of the LCD panels;
cutting the first substrate, without cutting at the same time the second substrate, to separate the first regions of the first substrate into separated third substrates each for a respective one of the LCD panels, wherein the step of cutting the first substrate exposes the outer leads on the inner surface of the second substrate;
adhering a third polarizer on an outer surface of the second substrate, the third polarizer comprising a plurality of fourth regions corresponding to the second regions of the second substrate, respectively;
cutting the third polarizer to separate the fourth regions of the third polarizer into separated fourth polarizers each for a respective one of the LCD panels; and
after the steps of cutting the first substrate and the third polarizer, cutting the second substrate to separate the second regions of the second substrate into separated fourth substrates each for a respective one of the LCD panels, so that the LCD panels are separated from each other.

2. The method according to claim 1, wherein the steps of cutting the first and third polarizers are performed by using excimer lasers or carbon dioxide lasers.

3. The method according to claim 1, wherein the steps of cutting the first and second substrates are performed by using carbon dioxide lasers.

4. The method according to claim 1, wherein
each third substrate and the corresponding fourth substrate are a color filter substrate and a thin film transistor substrates, respectively,
each thin film transistor substrate is larger than the corresponding color filter substrate,
the outer leads on the inner surface of each thin film transistor substrate are positioned adjacent and beyond a lateral side of the corresponding color filter substrate, and
wherein before the step of cutting the second substrate, the method further comprises the step of:
disposing a chip on each thin film transistor substrate through a chip on glass (COG) process, the chip being electrically connected to the outer leads of the corresponding LCD panel.

5. The method according to claim 1, wherein
each third substrate and the corresponding fourth substrate are a color filter substrates and a thin film transistor substrates, respectively,
each thin film transistor substrate is larger than the corresponding color filter substrate,
the outer leads on the inner surface of each thin film transistor substrate are positioned adjacent and beyond a lateral side of the corresponding color filter substrate, and
wherein before the step of cutting the second substrate, the method further comprises the steps of:
grinding the edges of the thin film transistor substrates and beveling the corners of the thin film transistor substrates; and
disposing a package on each ground and beveled thin film transistor substrate through a tape automatic bonding (TAB) process, the package being electrically connected to the outer leads of the corresponding LCD panel.

6. The method according to claim 1, wherein, between the step of adhering the third polarizer and the step of cutting the second substrate, the method further comprises the steps of:
electrically connecting a plurality of test cards to the LCD panels, respectively, via the outer leads which have been exposed by the step of cutting the first substrate;
correspondingly inputting a plurality of testing signals to the LCD panels by the respective test cards, and
observing the image quality of the LCD panels under light-emission.

7. The method according to claim 1, wherein, between the step of adhering the third polarizer and the step of cutting the second substrate, the method further comprises the steps of:
while moving a test card relatively to the LCD panels, electrically connecting the test card to one LCD panel at a time, via the outer leads which have been exposed by the step of cutting the first substrate;
inputting a testing signal to the LCD panels one by one by the test card, and
observing the image quality of each LCD panel under light-emission.

8. The method according to claim 1, wherein before the step of cutting the first substrate, the method further comprises the step of:
filling a liquid crystal material in each LCD panel, between the corresponding first region of the first substrate and the corresponding second region of the second substrate, and to be surrounded by the corresponding sealant.

9. The method according to claim 1, wherein the steps of cutting the first polarizer and first substrate are performed before the step of adhering the third polarizer on the outer surface of the second substrate.

10. The method according to claim 1, wherein the steps of cutting the first polarizer and first substrate are performed after the step of adhering the third polarizer on the outer surface of the second substrate.

11. The method according to claim 1, further comprising, after the step of cutting the first substrate and before the step of cutting the second substrate,
the step of testing the LCD panels by inputting testing signals to the LCD panels via the outer leads which have been exposed by the step of cutting the first substrate.

* * * * *